United States Patent
Shinoda et al.

(10) Patent No.: US 10,670,679 B2
(45) Date of Patent: Jun. 2, 2020

(54) MAGNETIC RESONANCE IMAGING APPARATUS AND IMAGE PROCESSING APPARATUS

(71) Applicant: Toshiba Medical Systems Corporation, Otawara-shi (JP)

(72) Inventors: Kensuke Shinoda, Sakura (JP); Shuhei Nitta, Ohta (JP)

(73) Assignee: Canon Medical Systems Corporation, Otawara-shi (JP)

( * ) Notice: Subject to any disclaimer, the term of this patent is extended or adjusted under 35 U.S.C. 154(b) by 330 days.

(21) Appl. No.: 15/639,823

(22) Filed: Jun. 30, 2017

(65) Prior Publication Data

US 2018/0003788 A1    Jan. 4, 2018

(30) Foreign Application Priority Data

Jul. 1, 2016    (JP) .................................. 2016-131942
Jun. 23, 2017    (JP) .................................. 2017-123023

(51) Int. Cl.
*G01R 33/46*    (2006.01)
*G01R 33/54*    (2006.01)
*G01R 33/565*    (2006.01)

(52) U.S. Cl.
CPC ..... *G01R 33/543* (2013.01); *G01R 33/56509* (2013.01)

(58) Field of Classification Search
CPC ............ G01R 33/543; G01R 33/56509; G01R 33/4633; G01R 33/482; G01R 33/5611; G01R 33/546; A61B 5/055

USPC .......................... 324/322, 307, 309, 318, 314
See application file for complete search history.

(56) References Cited

U.S. PATENT DOCUMENTS

| | | | | |
|---|---|---|---|---|
| 4,663,591 A | * | 5/1987 | Pelc | G01R 33/56509 324/309 |
| 4,668,915 A | * | 5/1987 | Daubin | G01R 33/28 324/309 |
| 4,683,431 A | * | 7/1987 | Pattany | G01F 1/716 324/306 |
| 4,687,659 A | * | 8/1987 | Quay | A61K 49/06 424/9.365 |
| 4,689,562 A | * | 8/1987 | Keren | G01R 33/56545 324/307 |

(Continued)

FOREIGN PATENT DOCUMENTS

| | | |
|---|---|---|
| JP | 2007-167634 | 7/2007 |
| JP | 2009-39519 | 2/2009 |

(Continued)

*Primary Examiner* — Jermele M Hollington
*Assistant Examiner* — Taqi R Nasir
(74) *Attorney, Agent, or Firm* — Oblon, McClelland, Maier & Neustadt, L.L.P.

(57) ABSTRACT

A magnetic resonance imaging apparatus according to embodiments includes sequence control circuitry and processing circuitry. The sequence control circuitry performs first imaging and second imaging to a subject. The processing circuitry detects a state of a setting of the subject by using a magnetic resonance image acquired from the first imaging, and causes a display to display supporting information that supports the setting of the subject based on information defected. The sequence control circuitry performs the second imaging on the subject after the supporting information is displayed.

22 Claims, 14 Drawing Sheets

(56) References Cited

U.S. PATENT DOCUMENTS

| | | | | |
|---|---|---|---|---|
| 4,692,704 | A * | 9/1987 | Gray | G01R 33/58 |
| | | | | 324/300 |
| 4,694,249 | A * | 9/1987 | Post | G01R 33/50 |
| | | | | 324/309 |
| 4,694,251 | A * | 9/1987 | Yoshitome | G01R 33/482 |
| | | | | 324/307 |
| 2007/0238963 | A1 | 10/2007 | Kaminaga et al. | |
| 2008/0211496 | A1 * | 9/2008 | Tanoue | G01R 33/3621 |
| | | | | 324/307 |
| 2009/0021257 | A1 | 1/2009 | Yasuhara | |
| 2009/0182221 | A1 | 7/2009 | Kasugai | |
| 2013/0267830 | A1 | 10/2013 | Ojha et al. | |
| 2015/0276910 | A1 * | 10/2015 | Soejima | A61B 5/055 |
| | | | | 324/309 |

FOREIGN PATENT DOCUMENTS

| | | |
|---|---|---|
| JP | 2009-183689 | 8/2009 |
| JP | 2011-45709 | 3/2011 |
| JP | 2014-507177 | 3/2014 |

\* cited by examiner

MAGNETIC RESONANCE IMAGING APPARATUS AND IMAGE PROCESSING APPARATUS

CROSS-REFERENCE TO RELATED APPLICATIONS

This application is based upon and claims the benefit of priority from Japanese Patent Application No. 2016-131942, filed on Jul. 1, 2016 and Japanese Patent Application No. 2017-123023, filed on Jun. 23, 2017; the entire contents of which are incorporated herein by reference.

FIELD

Embodiments described herein relate generally to a magnetic resonance imaging apparatus and an image processing apparatus.

BACKGROUND

In an examination using a magnetic resonance imaging apparatus, the condition regarding the setting of the subject is preferably constant for each time. For example, in a follow-up examination, unless imaging is performed for each time with the same condition regarding the setting of the subject such as posture, the observation target sometimes appears differently on the image, which is not desirable. Thus, for example, there is a method of standardizing (unifying) the condition regarding the setting of the subject as much as possible by, contriving a way of packing the mat and the cushions.

However, in such a case, it is sometimes the case to find out that the condition regarding the setting of the subject has not been standardized enough only after the completion of the imaging. In addition, when the operator of the imaging is not fully experienced, or the imaging is performed in a medical institution that does not have enough accumulated know-hows on imaging, it is sometimes the case that the condition on the setting of a subject cannot be fully standardised. Further, in the first place, the importance of standardizing (unifying) the condition regarding the setting of a subject is not fully recognized.

DETAILED DESCRIPTION

A magnetic resonance imaging apparatus according to embodiments includes sequence control circuitry and processing circuitry. The sequence control circuitry performs first imaging and second imaging to a subject. The processing circuitry detects a state of a setting of the subject by using a magnetic resonance image acquired from the first imaging, and causes a display to display supporting information that supports the setting of the subject based on information detected. The sequence control circuitry performs the second imaging on the subject after the supporting information is displayed.

The magnetic resonance imaging apparatus according to embodiments will be described in detail below with reference to the accompanying drawings.

First Embodiment

Figure 1:
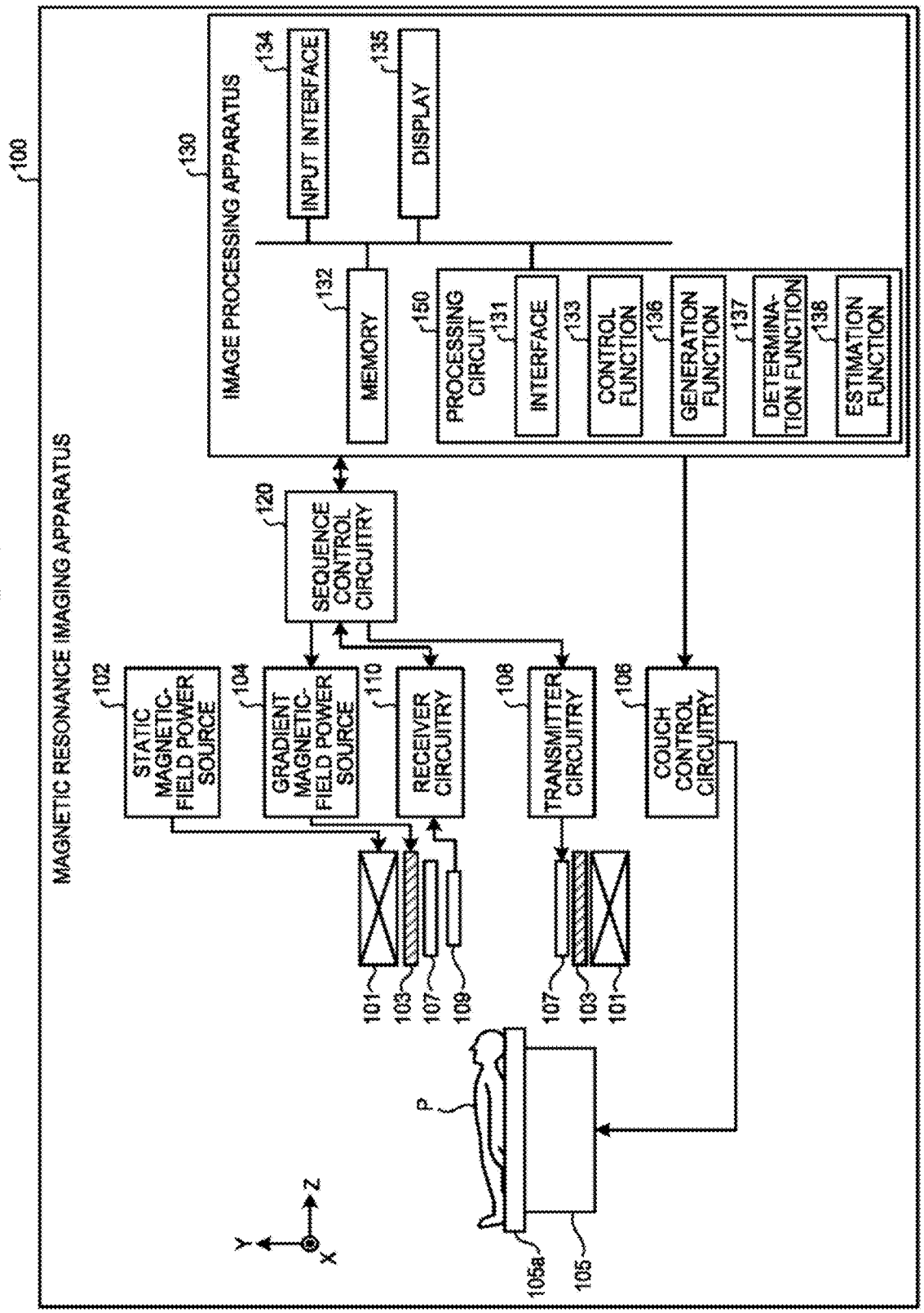
FIG. 1 is a diagram illustrating a magnetic resonance imaging apparatus according to embodiments.

FIG. 1 is a block diagram illustrating a magnetic resonance imaging apparatus 100 according to an embodiment. As illustrated in FIG. 1, the magnetic resonance imaging apparatus 100 includes a static magnetic field magnet 101, a static magnetic field power source 102, a gradient coil 103, a gradient magnetic field power source 104, a couch 105, couch control circuitry 106, a transmitter coil 107, transmitter circuitry 108, a receiver coil 109, receiver circuitry 110, sequence control circuitry 120 (an imaging unit), and an image processing apparatus 100. Note that the magnetic resonance imaging apparatus 100 does not include a subject P (for example, a human). In addition, the configuration illustrated in FIG. 1 is only an example. For example, each part in the sequence control circuitry 120 and the image processing apparatus 130 may be configured by being integrated or separated as appropriate.

The static magnetic field magnet 101 is a magnet formed in a substantially cylindrical shape with a hollow. In the inside space of the static magnetic-field magnet 101, a static magnetic field is generated. The static magnetic field magnet 101 is, for example, a superconducting magnet, or the like and is excited by receiving an electric current supplied from the static magnetic field power source 102. The static magnetic field power source 102 supplies the electric current to the static magnetic field magnet 101. Note that the static magnetic field magnet 101 may be a permanent magnet. In this case, the magnetic resonance imaging apparatus 100 need not include the static magnetic field power source 102. In addition, the static magnetic field power source 102 may be provided separately from the magnetic resonance imaging apparatus 100.

The gradient coil 103 is a coil formed in a substantially cylindrical shape with hollow, and is arranged inside the static magnetic field magnet 101. The gradient coil 103 is formed with a combination of three coils corresponding to respective axes of X, Y, and Z that intersect at right angles with each other. These three coils receive an electric current supplied individually from the gradient magnetic field power source 104 to generate a gradient magnetic field the magnetic field intensity of which varies along respective axes of X, Y, and Z. The gradient magnetic fields of respective axes of X, Y, and Z that are generated by the gradient coil 103 are, for example, a slice gradient magnetic field Gs, a phase-encoding gradient magnetic field Ge, and a read-out gradient magnetic field Gr, respectively. The gradient magnetic field power source 104 supplies an electric current to the gradient coil 103.

The couch 105 includes a couchtop 105a on which the subject P is placed. Under the control of the couch control circuitry 106, a couchtop 105a is inserted to a cavity (imaging port) of the gradient coil 103 in a state where the subject P is placed. Generally, the couch 105 is installed such that the longitudinal direction thereof is in parallel with the central axis of the static magnetic field magnet 101. The couch control circuitry 106 drives the couch 105 under the control of the image processing apparatus 130 to move the couchtop 105a in the longitudinal direction and the vertical direction.

The transmitter coil 107 is arranged inside the gradient coil 103 and generates a high-frequency magnetic field by receiving a radio frequency (RF) pulse supplied from the transmitter circuitry 108. The transmitter circuitry 100 supplies the RF pulse corresponding to a Larmor frequency determined by the type of a subject atom and the intensity of the magnetic field, to the transmitter coil 107.

The receiver coil 109 is arranged inside the gradient coil 103 and receives a magnetic resonance signal that is emitted from the subject P under the influence of the high-frequency magnetic field. Upon receiving the magnetic resonance signal, the receiver coil 103 outputs the received magnetic resonance signal to the receiver circuitry 110.

Note that the transmitter coil 107 and the receiver coil 103 described above are only examples. Configuration may be performed by one or combination of a coil including only a transmission function, a coil including only a reception function, and a coil including transmission and reception functions.

The receiver circuitry 110 detects the magnetic resonance signal that is output from the receiver coil 109 and generates magnetic resonance data on the basis of the detected magnetic resonance signal. Particularly, the receiver circuitry 110 generates the magnetic resonance data by performing digital transformation on the magnetic resonance signal that is output from the receiver coil 109. Furthermore, the receiver circuitry 110 transmits the generated magnetic resonance data to the sequence control circuitry 120. The receiver circuitry 110 may be provided at a gantry unit side having the static magnetic field magnet 101, the gradient coil 103, and the like.

The sequence control circuitry 120 performs imaging of the subject P by driving the gradient magnetic field power source 104, the transmitter circuitry 108, and the receiver circuitry 110 on the basis of sequence information transmitted from the image processing apparatus 130. The sequence information is information that defines a procedure for performing imaging. In the sequence information, the strength of the electric current to be supplied to the gradient coil 103 by the gradient magnetic field power source 104 and timing for supplying the electric current, the intensity of the RF pulse that is supplied to the transmitter coil 107 by the transmitter circuitry 108 and timing for applying the RF pulse, timing for detecting the magnetic resonance signal by the receiver circuitry 110, and the like are defined. For example, the sequence control circuitry 120 is an integrated circuit such as an application specific integrated circuit (ASIC) and a field programmable gate array (FPGA), or an electronic circuit such as a central processing unit (CPU) and a micro processing unit (MPU).

Upon receiving the magnetic resonance data from the receiver circuitry 110 as a result of imaging the subject P by driving the gradient magnetic-field power source 104, the transmitter circuitry 103, and the receiver circuitry 110, the sequence control circuitry 120 transfers the received magnetic resonance data to the image processing apparatus 130.

The image processing apparatus 130 performs overall control of the magnetic resonance imaging apparatus 100, image generation, and the like. The image processing apparatus includes a memory 132, an input interface 134, a display 135, and processing circuitry 150. The processing circuitry 150 includes an interface 131, a control function 133, a generation function 135, a determination function 137, and an estimation function 138. It is noted that the generation function 136 and the determination function 137 are examples of a detection unit.

In a first embodiment, each processing function performed by the interface 131, the control function 133, the generation function 136, the determination function 137, and the estimation function 138 is stored in the memory 132, as a computer program that can be executed by a computer. The processing circuitry 150 is a processor that reads out the computer program from the memory 132 and executes the computer program to implement the function corresponding to each computer program. In other words, the processing circuitry 150 that has been read out each computer program has each function illustrated in the processing circuitry 150 in FIG. 1. Note that, although description has been made with reference to FIG. 1 that the processing functions performed by the interface 131, the control function 133, the generation function 136, the determination function 137, and the estimation function 138 are implemented by the single processing circuitry 150, the functions may be implemented by configuring the processing circuitry 150 by a combination of a plurality of independent processors and executing the computer programs by each processor.

In other words, each of the functions described above may be configured as a computer program and one processing circuitry may execute each computer program, or a specific function may be mounted in a dedicated and independent computer program executable circuitry.

The term, "processor", used in the above description refers to, for example, a central processing unit (CPU), a graphical processing unit (GPU), or a circuit such as an application specific integrated circuit (ASIC), a simple programmable logic device (SPLD), a complex programmable logic device, and a field programmable gate array (FPGA).

The processor reads out the computer program stored in the memory 132 and executes the computer program to implement the function.

Note that the generation function 136, the control function 133, the display 135, the determination function 137, and the estimation function 138 are examples of a generation part, a control part, a display part, a determination part, and an estimation part, respectively.

Instead of storing the computer program in the memory 132, the computer program may be configured to be incorporated directly in the circuit of the processor. In this case, the processor reads out the computer program incorporated in the circuit and executes the computer program to implement the function. The couch control circuitry 106, the transmitter circuitry 106, the receiver circuitry 110, and the like are also configured by the electronic circuit such as the processor described above.

The processing circuitry 150 transmits the sequence information to the sequence control circuitry 120 and receives the magnetic resonance data from the sequence control circuitry 120, by the interface 131. Upon receiving the magnetic resonance data, the processing circuitry 150 having the interface 131 stores the received magnetic resonance data in the memory 132. The magnetic resonance data stored in the memory 132 is arranged in a k-space by the control function 133. As a result, the memory 132 stores k-space data.

The memory 132 stores the magnetic resonance data received by the processing circuitry 150 having the interface 131, the k-space data arranged in the k-space by the processing circuitry 150 having the control function 133, image data generated by the processing circuitry 150 having the generation function 136, and the like. For example, the memory 132 is a semiconductor memory element such as a random access memory (RAM) and a flash memory, a hard disc, and an optical disc. Note that, although in FIG. 1, description has been made that the memory 232 stores the computer programs corresponding to respective processing functions, a plurality of memories may be dispersed and arranged and the processing circuitry may be configured to read out the corresponding programs from independent storage circuits.

The input interface 134 receives various kinds of instructions or information input by an operator. The input interface 134 is implemented by, for example, a pointing device such as a mouse and a trackball, a selecting device such as a mode switching switch, an input device such as a keyboard, a touch pad that performs an input operation by a touch to an operation screen, a touch screen in which a display screen and a touch pad are integrated, non-contact input circuitry using an optical sensor, and speech input circuitry. The input interface 134 is connected to the control circuitry, transforms the input operation received from the operator to an electric signal and outputs the electric signal to the control circuitry. In this specification, the input interface 134 is not limited to the one including a physical operation component such as a mouse and a keyboard. Examples of the input interface 134 include processing circuitry for an electric signal that receives the electric signal corresponding to the input operation from an external input device provided separately from the device, and outputs this electric signal to the control circuitry. The display 135 displays an image or the like generated by a graphical user interface (GUI) for receiving an input of the imaging condition, and by the processing circuitry 15G having the generation function 136, under the control of the processing circuitry 150 having the control function 133. The display 135 is, for example, a display device such as a liquid crystal display.

The processing circuitry 150 performs overall control of the magnetic resonance imaging apparatus 100 by the control function 133 to control imaging, image generation, image display, and the like. For example, the processing circuitry 150 having the control function 133 receives an input of the imaging condition (imaging parameter, or the like) on the GUI, and generates the sequence information according to the received imaging condition. Further, the processing circuitry 150 having the control function 133 transmits the generated sequence information to the sequence control circuitry 120.

The processing circuitry 150 reads out the k-space data from the memory 132 by the generation function 136 and performs reconstruction processing such as the Fourier transform to the read out k-space data to generate an image. Further, the processing circuitry 150 generates predetermined supporting information described later by the generation function 136. These functions will be described later.

Next, the background related to the embodiment will be briefly described.

In magnetic resonance imaging, the sequence control circuitry 120 first performs imaging for generating a locator image that is an image for positioning in imaging for generating an image used for diagnosis. The locator image is an image that gives a ballpark picture of the structural information of the subject P and typically, a low-resolution image. Further, the sequence control circuitry 120 performs, if necessary, imaging for generating a sensitivity map that is a receiver sensitivity distribution of the receiver coil 103. Further, the sequence control circuitry 120 performs, if necessary, imaging for generating a shimming map that represents the intensity distribution of the static magnetic field (B0) and the high-frequency magnetic field (B1) a round the subject P. After performing such imaging as first imaging, the sequence control circuitry 120 performs second imaging for generating images for diagnosis such as a T1 emphasized image, and a T2 emphasized image.

In the second imaging, the condition regarding the setting of the subject is preferably the same for each time. For example, in a follow-up examination, unless the second imaging is performed with the same condition regarding the setting of the subject for each time, the observation target on the image sometimes appears differently, which is not desirable. Thus, there is a method of standardizing (unifying) the condition regarding the setting of the subject in the second imaging, such as posture, as much as possible, by, for example, contriving the way of packing the mat and the cushions.

For example, when the second imaging is performed with a ligament as the body part to be imaged so as to check the state of the ligament and the muscle, the degree of bending of joints influences extension and contraction and thickness of muscles. In addition, for example, when the arrangement of the coil is not the same, the contrast of the image changes.

In addition, for example, when the second imaging is performed with the head and the neck part as the body part to be imaged, the degree of movement of cerebrospinal fluid (CSF) changes if the way of bending of the neck is different However, it is sometimes the case that only after completion of the second imaging does it become recognized that the condition regarding the setting of the subject is not unified. In addition, when the operator of the second imaging operator not fully experienced, or the imaging is performed in a medical institution that does not have enough accumulated know-hows on imaging, the condition regarding the setting of the subject in the second imaging may not be sometimes unified enough. In the first place, it is sometimes the case that the importance of unifying the condition regarding the setting of the subject in the second imaging is not heeded enough.

With such background, the processing circuitry 150 of the magnetic resonance imaging apparatus 100 according to the embodiment generates supporting information that is information regarding the optimal setting of a subject in the second imaging, on the basis of the locator image generated on the basis of the first imaging performed on the subject. The processing circuitry 150 causes the display 135 to display the supporting information.

Figure 2:
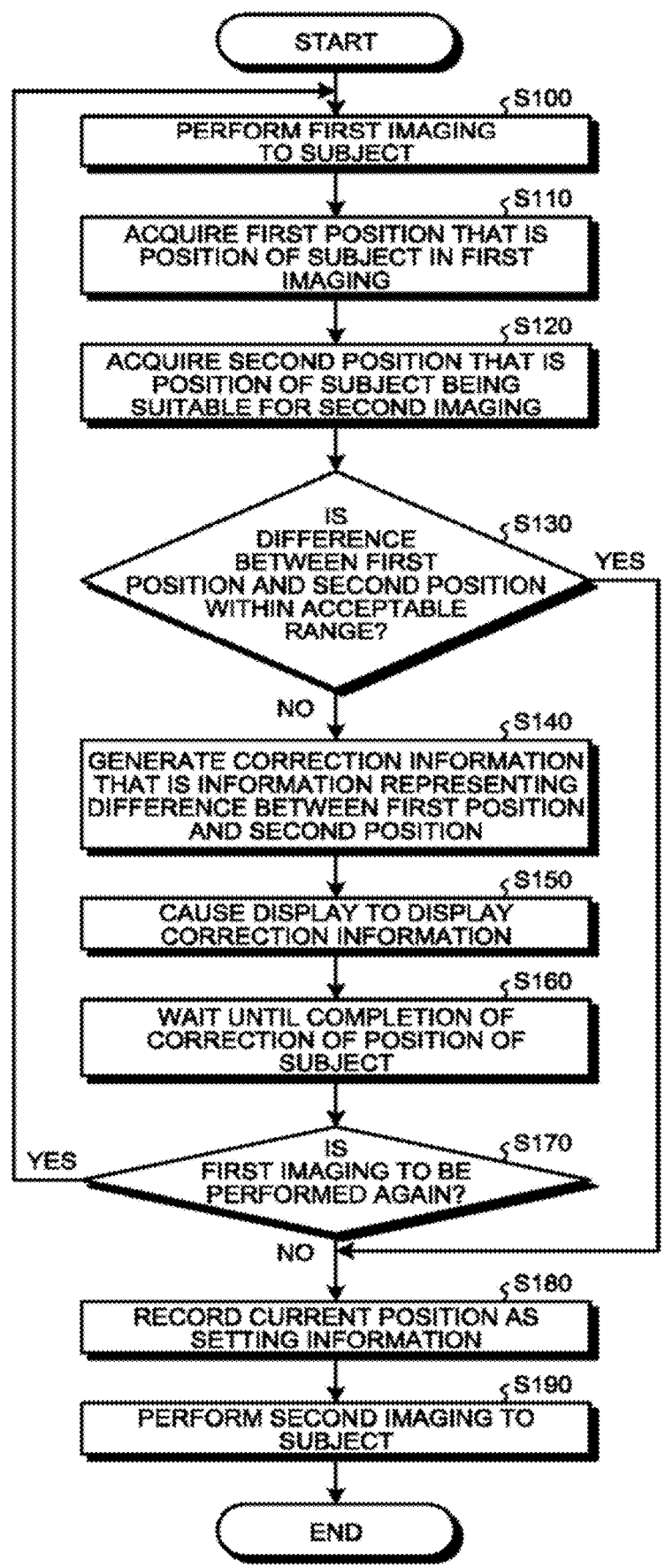
FIG. 2 is a flowchart illustrating a processing procedure performed by the magnetic resonance imaging apparatus according to the embodiments.
Figure 3:
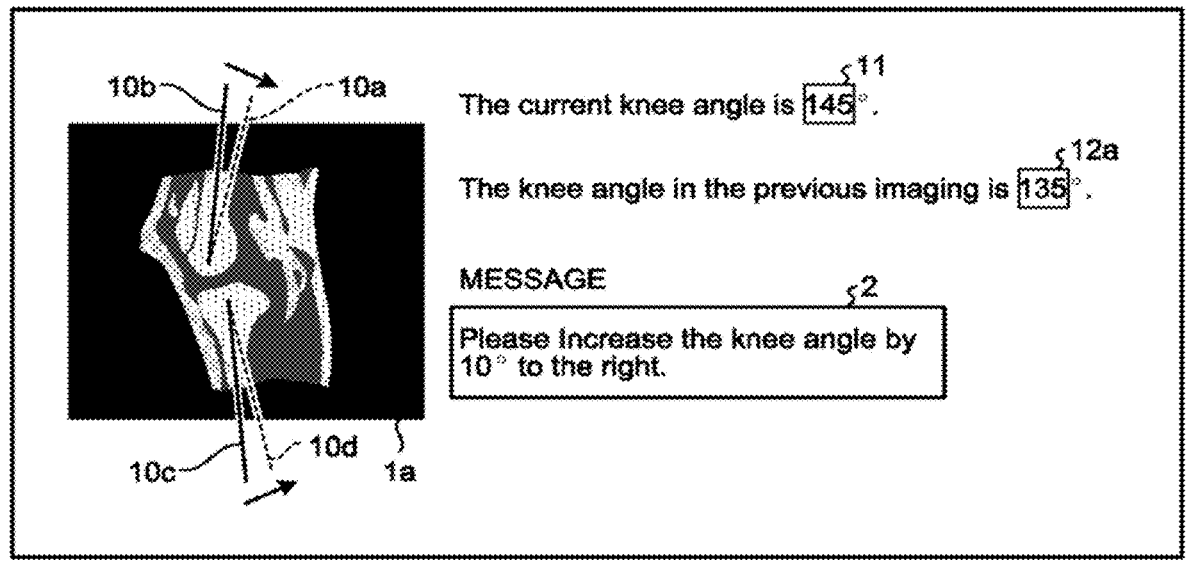
FIG. 3 is a diagram showing an example of a screen displayed by the magnetic resonance imaging apparatus according to a first embodiment.
Figure 4:
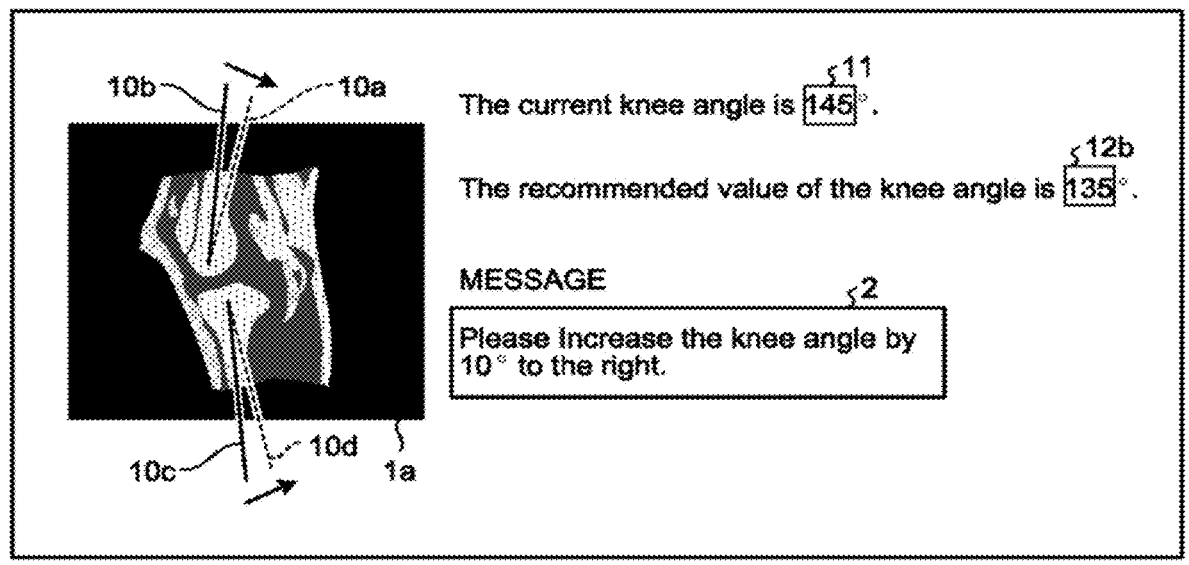
FIG. 4 is a diagram showing an example of the screen displayed by the magnetic resonance imaging apparatus according to the first embodiment.

This processing will be described with reference to FIG. 2 to FIG. 4. FIG. 2 is a flowchart illustrating a processing procedure performed by the magnetic resonance imaging apparatus according to the embodiment. The flowchart in FIG. 2 is the same from the first embodiment to the tenth embodiment. FIG. 3 is a diagram showing an example of a screen displayed by the magnetic resonance imaging apparatus according to the first embodiment. FIG. 4 is a diagram showing an example of the screen displayed by the magnetic resonance imaging apparatus according to the first embodiment. In the first embodiment, a case is described in which imaging is performed on the subject P including the knee part.

In FIG. 3, an image 1a is a locator image generated on the basis of the first imaging imaged including the knee part. A straight line 10a is a straight line that represents the longitudinal direction of a thighbone that is suitable for the second imaging performed after the first imaging. The straight line 10a is, for example, a straight line estimated on the basis of the imaging previously performed on the subject P. Similarly, a straight line 10d is a straight line that represents the longitudinal direction of a tibia that is suitable for the second imaging. A straight line 10b is a straight line that represents the longitudinal direction of the thighbone in the first imaging. A straight line 10c is a straight line that represents the longitudinal direction of the tibia in the first imaging. A display region 11 is a current knee angle, that is, a display region that displays an angle between the thighbone and the tibia in the first imaging. A display region 15a is a display region that displays an angle of the knee in a previous imaging to the subject P. A display region 2 is a region that displays a message to a user.

Referring back to FIG. 2, first of all, the sequence control circuitry 120 performs the first imaging on the subject P (step S100i. The first imaging is, for example, imaging for acquiring the locator image that is an image that gives a ballpark picture of the structure information of the subject P. The sequence control circuitry 120 performs the first imaging by using, for example, 3D fast field echo (FFE) sequence, or 3D steady-state free precession (SSFP) sequence. The sequence control circuitry 120 applies a T2 preparation pulse to emphasize a tissue contrast of an image before the pulse sequence. In the first embodiment, the sequence control circuitry 120 performs the first imaging including the knee part on the subject P.

Subsequently, the processing circuitry 150 acquires a first position that is the position of the subject P in the first imaging (step S110). In the first embodiment, the processing circuitry 150 acquires, for example, the straight line 10b and the straight line 10c that represent the longitudinal direction of the knee of the subject P in the image 1a as the first position. More specifically, the processing circuitry 150 acquires the straight line 10b that represents the longitudinal direction of the thighbone and the straight line 10c that represents the longitudinal direction of the tibia. Subsequently, the processing circuitry 150 calculates an angle of knee bending of the subject P in the image 1a on the basis of the acquired straight line 10b that represents the longitudinal direction of the thighbone and the straight line 10c that represents the longitudinal direction of the tibia, by the generation function 136. For example, the processing circuitry 150 calculates the angle of knee bending of the subject P in the image 1a as 145° by the generation function 136.

In this way, the processing circuitry 160 detects, by the generation function 136 as the detection unit, a state of a setting of the subject P using the magnetic resonance image acquired from the first imaging.

Subsequently, the processing circuitry 150 acquires a second position that is the position of the subject P being suitable for the second imaging performed after the first imaging (step S120). In the first embodiment, as illustrated in FIG. 3, the processing circuitry 150 acquires, for example, the straight line 10a that is a straight line representing the longitudinal direction of the thighbone being suitable for the second imaging and the straight line 10d that is a straight line representing the longitudinal direction of the tibia being suitable for the second imaging, as the second position. In the first embodiment, the sequence control circuitry 120 performs the second imaging including the knee part on the subject P.

The processing circuitry 160, for example, estimates the second position on the basis of imaging previously performed on the subject P by the estimation function 133. For example, in FIG. 3, the processing circuitry 150 estimates the straight line 10a and the straight line 10d as the second position on the basis of the imaging previously performed on the subject P, by the estimation function 133. Subsequently, the processing circuitry 150 calculates an angle of knee bending that the subject P is supposed to keep in the second imaging on the basis of the straight line 10a that represents the longitudinal direction of the thighbone being suitable for the second imaging and the straight line 10d that represents the longitudinal direction of the thighbone being suitable for the second imaging, by the generation function 136. For example, the processing circuitry 150 calculates the angle of the knee bending that the subject P is supposed to keep) in the second imaging as 135° by the generation function 136. In the example of FIG. 3, the angle of the knee bending that the subject P is supposed to keep in the second imaging is equal to the angle or the knee in the previous imaging.

The processing circuitry 150 determines whether a difference between the first position and the second position is within an acceptable range by the determination function 137 (step S130). In other words, the processing circuitry 150 determines whether the first position is a position that is suitable for the second imaging on the basis of the image 1a generated on the basis of the first imaging, by the determination function 137. The processing circuitry 150 causes the display 135 to display the determined result by the control function 133.

When the processing circuitry 150 determines that the difference between the first position and the second position is within the acceptable range by the determination function 137 (Yes at step S130), the correction of the position of the subject P is not necessary. Thus, the processing proceeds to step S180 and the processing circuitry 150 stores the current position as the setting information. After that, in step S190, the sequence control circuitry 120 performs the second imaging on the subject P.

On the other hand, when the processing circuitry 150 determines that the difference between the first position and the second position is not within the acceptable range by the determination function 137 (No at step S130), the processing proceeds to step S140.

The processing circuitry 150 generates information (also referred to as the correction information) representing the difference between the first position that is the position of the subject P in the first imaging and the second position that is the position of the subject P being suitable for the second imaging performed after the first imaging on the basis of the image 1a generated on the basis of the first 1 magi rig performed on the subject P, and on the second position estimated described above by the estimation function 138, by the generation function 136 (step S140).

The correction information that is information representing the difference between the first position and the second position is an example of the supporting information that supports the setting of the subject, the first position being the position of the subject P in the first imaging and the second position being the position of the subject P suitable for the second imaging performed subsequent to the first imaging. It is noted, however, that examples of the supporting information that supports the setting of the subject are not limited to this case. For example, as an example of the supporting information, the supporting information may be information representing the second position that is the position of the subject P suitable for the second imaging performed subsequent to the first imaging. Further, as another example of the supporting information, the supporting information may be information as to whether the difference between the first position and the second position is within an acceptable range.

The information generated by the processing circuitry 150 in step S140 is information that represents the difference between the first position and the second position. The first position is, for example, characterized by the straight line 10b and the straight line 10c in FIG. 3. The second position is, for example, characterized by the straight line 10a and the straight line 10d in FIG. 3. Accordingly, for example, information representing the difference between an angle between the straight line 10b and the straight line 10c and an angle between the straight line 10a and the straight line 10d becomes an example of the supporting information representing the difference between the first position and the second position. In other words, the processing circuitry 150 generates the correction information (the supporting information) on the basis of a difference between an angle of the knee bending of the subject P in the image 1a and an angle of the knee bending that the subject P is supposed to keep in the second imaging, by the generation function 136. In FIG. 3, for example, the angle of the knee bending of the subject P in the image 1a, that is, an angle between the straight line 10b and the straight line 10c is 145°. In addition, for example, the angle of the knee bending that the subject P is supposed to keep in the second imaging is 135°. Thus, the processing circuitry 150 generates the correction information (the supporting information) that "The angle of knee bending is 145°–135° ™+10° larger than that in the previous imaging".

In addition, as another example of the correction information (the supporting information), in step S140, the processing circuitry 150 may generate information for correcting the position of the subject P, by the generation function 136. In this case, for example, the processing circuitry 150 generates the correction information (the supporting information) that "It is desirable to increase the knee angle by 10° to the right" by the generation function 136.

In this way, the processing circuitry 150 generates, by the generation function 136, the supporting information that supports the setting of the subject, on a basis of the information detected at Step S110 and Step S120.

Subsequently, the processing circuitry 150 causes the display 135 to display the information generated by the processing circuitry 150 by using the generation function 136 in step S140, by the control function 133 (step S150). In other words, the processing circuitry 150 causes the display 135 to display the supporting information by the control function 133 as a display control unit. For example, as illustrated in FIG. 3, the processing circuitry 150 causes a display region 2 of the display 135 to display a message that "Please increase the knee angle by 10° to the right" on the basis of the correction information (the supporting information) that "It is desirable to increase the knee angle by 10° to the right", by the control function 133. In addition, for example, the processing circuitry 150 may cause the display region 2 of the display 135 to display a message that "The angle of the knee bending is +10° larger than that in the previous imaging" on the basis of the correction information (the supporting information) that "The angle of the knee bending is +10° larger than that in the previous imaging", by the control function 133. In addition, as illustrated in FIG. 3, for example, the processing circuitry 150 may cause the display region 11 of the display 135 to display the current knee angle and cause the display region 12a of the display 135 to display the knee angle in the previous imaging, by the control function 133.

Subsequently, the sequence control circuitry 120 waits until correction of the position of the subject P is completed (step S160). That is, the sequence control circuitry 120 waits until correction of the position of the subject P by at least one of the user and the subject P himself/herself, performed on the basis of the correction information (the supporting information) generated by the generation function 136 in step S140.

The processing circuitry 150 receives an input of whether the first imaging is performed again, from the user through the input interface 134 by the interface 131 (step S170). When the processing circuitry 150 receives the input that the first imaging is performed again, from the user (Yes at step S170), the processing returns to step S100. On the other hand, when the processing circuitry 150 receives the input that the first imaging is not performed again, from the user (No at step S170), the processing proceeds to step S150.

Subsequently, the processing circuitry 150 stores a value of a parameter currently set such as a current position of the subject P, in the memory 132 as the setting information (step S180). Data stored in the memory 132 in step S160 is called and utilized by the processing circuitry 150 as needed, for example, when imaging to the same subject P is performed.

In step S100, after the correction of the position of the subject P is completed, the sequence control circuitry 120 performs the second imaging. In other words, the sequence control circuitry 120 performs the second imaging to the subject P after the supporting information is displayed on the display 135.

With reference to FIG. 3, a case where, in step S120, the processing circuitry 150, for example, estimates the second position that is the position of the subject P being suitable for the second imaging on the basis of the imaging previously performed on the subject P by the estimation function 133, has been described. However, the embodiment is not limited to this case. Such case will be described with reference to FIG. 4.

In FIG. 4, as similar to FIG. 3, the image 1a is the locator image generated on the basis of the first imaging imaged including the knee part. The straight line 10a is a straight line that represents the longitudinal direction of the thighbone being suitable for the second imaging. For example, the straight line 10a is a straight line estimated on the basis of know-hows and statistical data. Similarly, the straight line 10d is a straight line that represents the longitudinal direction of the tibia being suitable for the second imaging. The straight line 10b is a straight line that represents the longitudinal direction of the thighbone in the first imaging. The straight line 10c is a straight line that represents the longitudinal direction of the tibia being suitable for the first imaging. The display region 11 is a display region that displays the current knee angle. A display region 12b is a display region that displays a recommended value of the knee angle acquired on the basis of the know-hows and the statistical data. The display region 2 is a region that displays a message to the user.

For example, in step S120, the processing circuitry 150 estimates the second position that is the position of the subject P being suitable for the second imaging on the basis of the statistical data such as know-hows, by the estimation function 138. For example, in FIG. 4, the processing circuitry 150 estimates the straight line 10a and the straight line 10d as the second position on the basis of the statistical data such as know-hows, by the estimation function 138. As similar to FIG. 3, the processing circuitry 150 calculates the knee bending angle that the subject P is supposed to keep in the second imaging on the basis of the straight line 10a that represents the longitudinal direction of the thighbone being suitable for the second imaging and the straight line 10d that represents the longitudinal direction of the thighbone being suitable for the second imaging, by the generation function 136. Using the know-hows or the like, for example, that the depiction of the important body part is omitted because of the magic angle can be prevented.

In step S140, the processing circuitry 150 generates the supporting information (correction information) that is information representing the difference between the first position that is the position of the subject P in the first imaging and the second position that is the position of the subject P being suitable for the second imaging performed after the first imaging, on the basis of the image 1a generated on the basis of the first imaging performed on the subject P and on the second position estimated as described above by the estimation function 238, by the generation function 136.

For example, the processing circuitry 150 generates the correction information (the supporting information) that "the knee bending angle is +10° larger than the recommended value of the knee angle acquired on the basis of statistical data such as know-hows". As similar to the case of FIG. 3, for example, the processing circuitry 150 may generate the correction information (the supporting information) that "It is desirable to increase the knee angle by 10° to the right" by the generation function 136.

Subsequently, the processing circuitry 150 causes the display 185 to display the information generated by the processing circuitry 150 by using the generation function 135 in step S140, by the control function 133 (step S150). For example, as illustrated in FIG. 4, the processing circuitry 150 causes the display region 2 of the display 155 to display a message that "Please increase the knee angle by 10° to the right". As illustrated in FIG. 4, in addition, for example, the processing circuitry 150 may cause the display region 11 of the display 135 to display the current knee angle and cause the display region 12b of the display 135 to display the recommended value of the knee angle, by the control function 133.

Note that not only in the first embodiment but also in the embodiments described later similarly, may the processing circuitry 150 estimate the second position on the basis of the statistical data such as know-hows, by the estimation function 188.

A case where, in step S120, the processing circuitry 150 measures again and calculates the knee bending angle that the subject P is supposed to keep in the second imaging from the image of previous examination data, has been described. However, the embodiment is not limited to this case. For example, the processing circuitry 150 may measure the knee bending angle for every examination and store the measured knee bending angle in the memory 132. In this case, the processing circuitry 150 calculates the knee bending angle that the subject P is supposed to keep in the second imaging by acquiring the knee bending angle that has been already measured and is stored in the memory 132, from the memory 132, in step S120.

The processing circuitry 150 may store the longitudinal direction of the thighbone and the longitudinal direction of the tibia instead of the knee bending angle in the memory 132. In this case, the processing circuitry 150 acquires the longitudinal direction of the thighbone and the longitudinal direction of the tibia stored in the memory 132 that has been already measured, from the memory 132 in step S120 and calculates the knee bending angle that the subject P is supposed to keep in the second imaging on the basis of the acquired longitudinal directions.

The order of step S110 and step S120 may be arbitrary. For example, the processing circuitry 150 may perform the processing of step S120, and after that, perform the processing of step S110. In addition, this is not limited to the first embodiment, and is applicable to the embodiments described later.

A case where the processing circuitry 150, for example, in step S110, acquires the straight line 10b and the straight line 10c, calculates the knee bending angle of the subject P in the image 1a on the basis of the acquired straight line 10b and the straight line 10c, then acquires the straight line 10a and the straight line 10d in step S120, and calculates the knee bending angle that the subject P is supposed to keep in the second imaging on the basis of the acquired straight line 10a and the straight line 10d, has-been described. The embodiment is not limited to this case. The processing circuitry 150 may, for example, in step S110, acquire the straight line 10b and the straight line 10c, then acquire the straight line 10a and the straight line 10d in step S120, then calculate the knee bending angle of the subject P in the image 1a on the basis of the straight line 10b and the straight line 10c, and then calculate the knee bending angle that the subject P is supposed to keep in the second imaging on the basis of the straight line 10a and the straight line 10d.

For the first embodiment, a case where the magnetic resonance imaging is performed including the knee part on the subject P, has been described. However, the embodiment is not limited to this case. As will be described for the embodiment described later, the first imaging and the second imaging may be imaging for the breast, the brain, the cervical vertebrae, the shoulder, the spine, the abdomen, or the like. In addition, a case where the first imaging is imaging other than so called main imaging (diagnostic imaging) has been described. However, for example, main imaging (image for diagnosis) imaged in the past may be utilised as the first imaging.

As described above, in the magnetic resonance imaging apparatus 100 according to the embodiment, the processing circuitry 150 generates information that represents the difference between the first position that is the position of the subject in the first imaging and the second position that is the position of the subject in the second imaging and the information is displayed. According to this, for example, the setting of the subject can be performed with a certain precision by both an expert and a non-expert on the basis of the locator image without an effect of the technique level of the subject setting of the user.

As an example, in the first embodiment, setting for the knee bending angle is performed. Depending on knee bending, extension and thickness of a muscle change. On the other hand, the knee bending angle is hard to see from the outside. However, by using the magnetic resonance imaging apparatus 100 according to the first embodiment, suitable setting of the subject can be performed and the image quality becomes stable.

Second Embodiment

For the first embodiment, a case where the setting is performed for the knee bending angle has been described. For the second embodiment, with reference to the flowchart in FIG. 2 again and with reference to FIG. 5, a case where the setting is performed for a position where a coil is wound on the basis of the locator image will be described. Note that, in the flowchart in FIG. 2, processing in step S160 to step S190 is similar processing to that in the first embodiment. Thus, description for these steps will be omitted.

Figure 5:
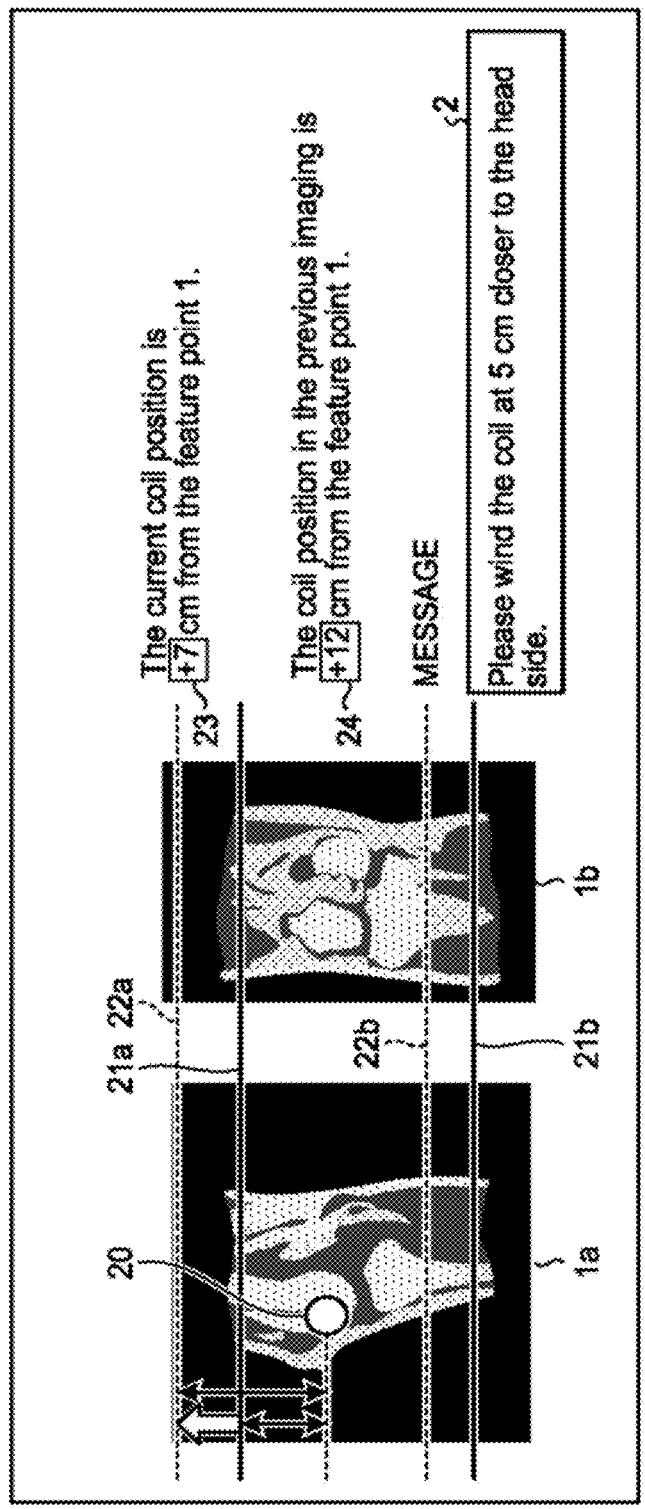
FIG. 5 is a diagram showing an example of a screen displayed by a magnetic resonance imaging apparatus according to a second embodiment.

FIG. 5 is a diagram showing an example of a screen displayed by a magnetic resonance imaging apparatus according to the second embodiment.

In FIG. 5, the image 1a and an image 1b are the locator images generated on the basis of the first imaging imaged including the knee part. The image 1a is a sagittal image and the image 1b is a coronal image. A feature point 20 is a feature point of a knee that can be extracted by using a predetermined technology. A sensitivity region edge 21a represents an upper end of a sensitivity region of a coil in the first imaging. A sensitivity region edge 21b represents a lower end of the sensitivity region of the coil in the first imaging. A sensitivity region edge 22a represents, for example an upper end of a sensitivity region of a coil in previous imaging. A sensitivity region edge 22b represents, for example, a lower end of the sensitivity region of the coil in the previous imaging. The display region 2 is a region that displays a message to the user. A display region 23 is a display region that displays the current coil position with the feature point 20 as a reference. A display region 24 is a display region that displays the coil position in the previous imaging with the feature point 20 as a reference.

With reference to the flowchart in FIG. 2 again, first, the sequence control circuitry 120 performs the first imaging on the subject P as similar to the first embodiment (step S100).

The following describes a case where imaging is performed including the knee part as the body part to be imaged. However, the embodiment is not limited to this case.

The embodiment can be applied to other body parts to be imaged similarly.

Subsequently, the processing circuitry 150 acquires the first position that is the position of the subject P in the first imaging (step S110). In other words, the processing circuitry 1500 detects, by the generation function 136 as the detecting unit, a state of the setting of the subject, using the magnetic resonance image acquired from the first imaging. In the second embodiment, the position of the subject P refers to a relative position of the subject P with respect to the coil. Acquiring the relative position of the subject P with respect to the coil is equivalent to acquiring the relative position of the coil with respect to the subject P. Thus, the operation in step S110 is equivalent to that the processing circuitry 150 acquires the position of the coil with respect to the subject P in the first imaging.

In the second embodiment, the processing circuitry 150 calculates the sensitivity region edge 21a and the sensitivity region edge 21b on the basis of a signal profile in the image 1a and the image 1b by the generation function 136. Particularly, the processing circuitry 150 divides the image 1a and the image 1b into a region of which the signal profile exceeds a predetermined threshold and a region of which the signal profile is lower than the predetermined threshold by the generation function 136, and calculates the sensitivity region edge 21a and the sensitivity region edge 21b as a boundary between the divided regions.

Subsequently, the processing circuitry 150 specifies the feature point 20 that is a reference of the position by using a predetermined technique such as the slice detection technology of knee, by the generation function 136. Subsequently, the processing circuitry 150 calculates a distance from the specified feature point 20 to the calculated sensitivity region edge 21a, by the generation function 136. In other words, the processing circuitry 150 detects, by the generation function 136, the feature point 20 of a body part of the subject P, from a magnetic resonance image acquired from the first imaging. The processing circuitry 150 detects the state of the setting of the subject P using the feature point detected.

When a possibility that a knee is placed obliquely is taken info consideration, as an example, the processing circuitry 150 calculates the distance from the specified feature point 20 to the calculated sensitivity region edge 21a on the basis of a distance along the longitudinal direction of a bone. The longitudinal direction of the bone can be calculated by using a predetermined technique such as the slice-alignment method. In addition, as another example, the processing circuitry 150 calculates the distance from the specified feature point 20 to the calculated sensitivity region edge 21a on the basis of the distance in a normal direction of an axial cross section of the knee, by the generation function 135. More simply, as another example, the processing circuitry 150 calculates the distance from the specified feature point 20 to the calculated sensitivity region edge 21a on the image 1a by the generation function 136. For example, the processing circuitry 150 calculates the distance from the specified feature point. 20 to the calculated sensitivity region edge 21a as 7 cm by the generation function 136.

Subsequently, the processing circuitry 150 estimates the second position that is the position of the subject P being suitable for the second imaging performed after the first imaging and acquires the second position (step S120). Particularly, the processing circuitry 150, for example, calculates the sensitivity region edge 22a and the sensitivity region edge 22b on the basis of the imaging previously performed on the subject P, as similarly to step S110, by the generation function 136.

Subsequently, the processing circuitry 150 specifies a feature point that is in the imaging previously performed and corresponds to the feature point 20 in the first imaging, by using a predetermined technique such as the slice-alignment method of knee, by the generation function 136. Subsequently, the processing circuitry 150 calculates a distance from the specified feature point to the calculated sensitivity region edge 22*a* by the generation function 136. For example, the processing circuitry 150 calculates the distance from the specified feature point to the calculated sensitivity region edge 22*a* as 12 cm by the generation function 136.

The processing circuitry 150 determines whether the difference between the first position and the second position is within the acceptable range by the determination function 137 (step S130). That is, the processing circuitry 150, for example, determines whether the difference between the distance from the feature point 20 in the first imaging to the sensitivity region edge 21*a* and the distance from the feature point in the imaging previously performed to the sensitivity region edge 22*a* is within the acceptable range.

When the processing circuitry 150 determines that the difference between the first position and the second position is within the acceptable range by the determination function 137 (Yes at step S130), the correction of the position of the coil is not necessary. Thus, the processing proceeds to step S130 and the processing circuitry 150 stores the current position as the setting information. After that the sequence control circuitry 120 performs the second imaging on the subject P in step S190.

On the other hand, when the processing circuitry 150 determines that the difference between the first position and the second position is not within the acceptable range by the determination function 137 (No at step S130), the processing proceeds to step S140.

In step S140, the processing circuitry 150 generates the correction information (the supporting information) on the basis of the difference between an arrangement position of an array coil in the first imaging estimated on the basis of the distance from the feature point 20 in the first imaging to the sensitivity region edge 21*a*, and an arrangement position of an array coil that is suitable for the second imaging estimated on the basis of the distance from the feature point in the imaging previously performed to the sensitivity region edge 22*a*, by the generation function 136. In other words, the processing circuitry 150 generates the correction information (the supporting information) on the basis of the difference between the arrangement position of the array coil in the first imaging that is an arrangement position estimated on the basis of the signal profile of the image 1*a* generated on the basis of the first imaging and the arrangement position of the array coil that is suitable for the second imaging, by the generation function 136 (step S140). For example, the processing circuitry 150 generates the correction information (the supporting information) that "the arrangement position of the array coil shifts downward by about 5 cm from that in the previous imaging", by the generation function 136. In addition, for example, the processing circuitry 150 generates the correction information (the supporting information) that "It is desirable to wind the array coil at 5 cm closer to the head side" by the generation function 136.

Subsequently, the processing circuitry 150 causes the display 135 to display the information generated by the processing circuitry 150 by using the generation function 136 in step S140, by the control function 133 (step S150). For example, as illustrated in FIG. 5, the processing circuitry 150 causes the display region 2 of the display 135 to display a message that "Please wind the coil at 5 cm closer to the head side" on the basis of the correction information (the supporting information) that "It is desirable to wind the array coil at 5 cm closer to the head side" by the control function 133. In addition, for example, the processing circuitry 150 may cause the display region 2 of the display 135 to display a message that "The arrangement position of the array coil shifts downward by about 5 cm from that in the previous imaging" on the basis of the correction information (the supporting information) that "The arrangement position of the array coil shifts downward by about 5 cm from that in the previous imaging", by the control function 133. As illustrated in FIG. 5, in addition to this, for example, the processing circuitry 150 may cause the display region 23 of the display 135 to display the current coil position with the feature point 20 as a reference, and cause the display region 24 of the display 135 to display the coil position in the previous imaging with the feature point in the previous imaging as a reference, by the control function 133.

Note that the embodiment is not limited to a case where the second position is acquired on the basis of the imaging previously performed. The second position may be estimated on the basis of the statistical data such as know-hows.

In the above example, a case has been explained in which the processing circuitry 150 detects the sensitivity region edges 21*a* and 21*b* based on the locator image generated based on the first image and the processing circuitry 150 supports the setting of the subject based on the sensitivity region edges 21*a* and 21*b*. However, it is noted that embodiments are not limited to this case. The processing circuitry 150 may detect the center of the coil and supports the setting of the subject based on the center of the coil detected. Such case will be explained.

First of all, the sequence control circuitry 120 performs a first imaging to the subject P. Here, the first imaging is, for example, an imaging including the knee part of the subject P.

Subsequently, the sequence control circuitry 120 detects, by the generation function 156 as the detecting unit, the state of the setting of the subject, using the magnetic resonance image acquired from the first imaging.

Specifically, the processing circuitry 150 detects, by the generation function 130 as the detecting unit, a feature point of a body part of the subject, from the magnetic resonance image acquired from the first imaging. As an example, the processing circuitry 150 detects, from the generation function 136 as the detecting unit, the feature point 20 of the knee part, from the magnetic resonance image acquired from the first imaging.

Subsequently, the processing circuitry 150 detects, by the generation function 136 as the detecting unit, the center of the coil. Here, the processing circuitry 140 detects, by the generation function 36, the position which a light projector shows as the center of coil, as the center of the coil. In another example, the processing circuitry 150 may detect, by the generation function 136, the center of the magnetic field estimated by measurement of the magnetic, field and so on, as the center of the coil.

Subsequently, the processing circuitry 150 detects, by the generation function 135 as the detecting unit, the state of the setting of the subject, based on the distance between the feature point detected and the center of the coil. As an example, the processing circuitry 150 detects, by the generation function 136 as the detecting unit, detects the state of the setting of the subject, on a basis of the distance between the center of the coil and the feature point 20 of the knee detected from the magnetic resonance image acquired from the first imaging.

For example, in a case in which the feature point 20 of the knee is normally in a position of +12 cm from the center of the coil and the feature point 20 of the knee detected from the magnetic resonance image acquired from the first imaging is in a position of +7 cm from the center of the coil, the processing circuitry 150 detects, by the generation function 136 as the detecting unit, the state of the setting of the subject as "It is desirable to wind the coil at 5 cm closer to the head side". Further, for example, in a case in which the feature point 20 of the knee is in a position of +12 cm from the center of the coil in the previous imaging and the feature point 20 of the knee detected from the magnetic resonance image acquired from the first imaging is in a position of +7 cm from the center of the coil, the processing circuitry 150 detects, by the generation function 135 as the detecting unit, the setting of the subject as "It is desirable to wind the coil at 5 cm closer to the head side".

Subsequently, the processing circuitry 150 generates, by the generation function 136 as the detecting unit, the supporting information that supports the setting of the subject, on a basis of the detected state of the setting of the subject. Here, the supporting information is, for example, information such as "It is desirable to wind the coil at 5 cm closer to the head side".

Subsequently, the processing circuitry 150 causes the display 135 to display the supporting information generated, by the control function 133 as the display control unit. For example, the processing circuitry 150 causes the display 135 to display, by the control function 133 as the display control unit, the supporting information that compares the distance between the feature point 20 and the center of the coil to a threshold. For example, the processing circuitry 150 causes the display 135 to display, by the control function 133 as the display control unit, the supporting information indicating "It is desirable to wind the coil at 5 cm closer to the head side". As another example, the processing circuitry 150 causes the display 135 to display, by the control function 133 as the display control unit, the supporting information indicating "It is desirable to change the position of the coil because the distance between the feature point 20 and the center of the coil exceeds 10 cm, which is the threshold".

Subsequently, the sequence control circuitry 120 performs the second imaging to the subject after the supporting information is displayed. Here, the second imaging is, for example, imaging including the knee part of the subject.

In this way, the setting of an appropriate winding position of an array coil can be performed, not only by using the sensitivity edge of the coil but also by using the center position of the coil.

As described above, the magnetic resonance imaging apparatus 100 according to the second embodiment performs the setting for the winding position of the array coil by using, for example, the locator image. Consequently, appropriate setting for the winding position of the array coil can be performed and the image quality becomes stable.

Third Embodiment

For a third embodiment, with reference to the flowchart in FIG. 2 again, and with reference to FIG. 6 and FIG. 7, a case where setting for knee twisting is performed on the basis of the locator image will be described. In the flowchart in FIG. 2, also in the third embodiment, processing of step S160 to step S130 is similar processing to that in the first embodiment. Thus, description for these steps will be omitted.

Figure 6:
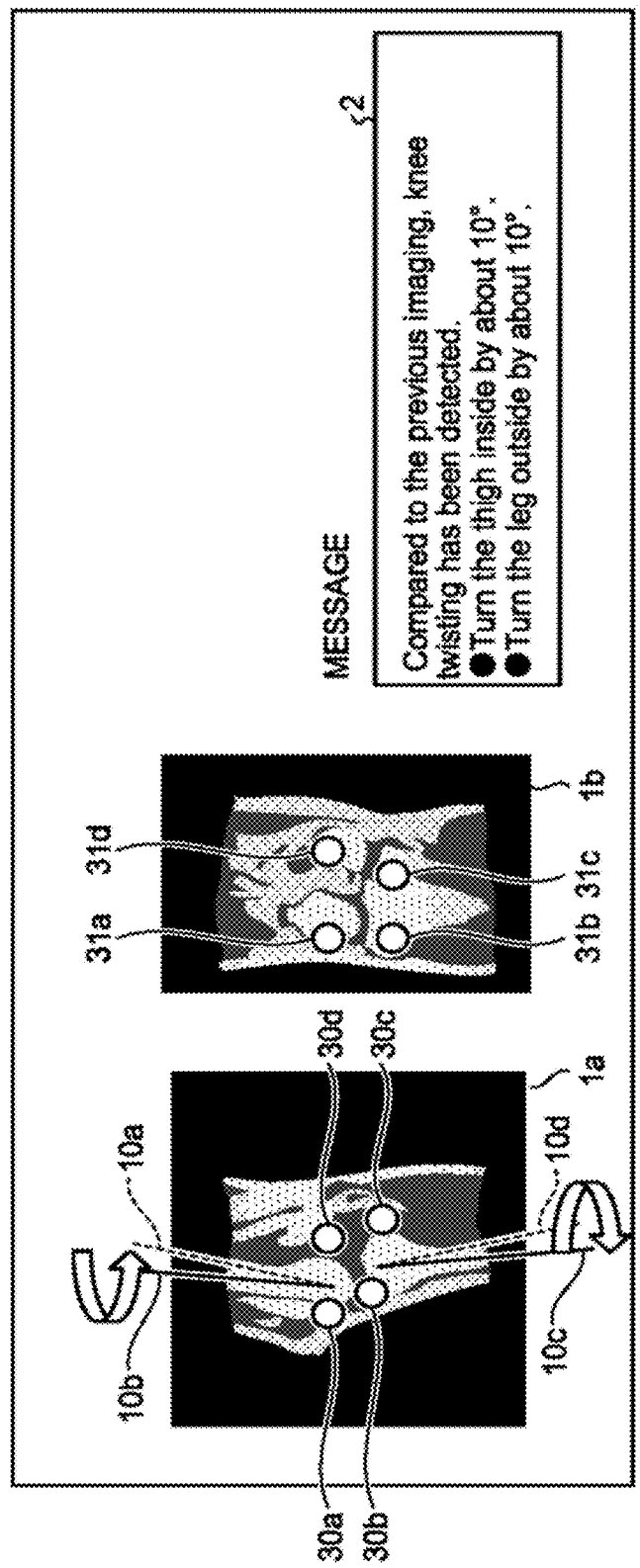
FIG. 6 is a diagram showing an example of a screen displayed by a magnetic resonance imaging apparatus according to a third embodiment.
Figure 7:
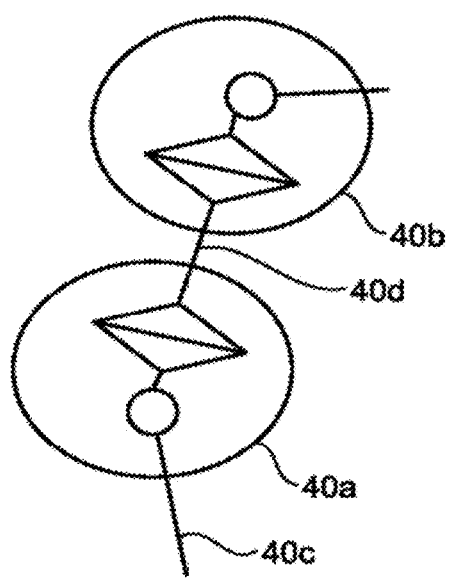
FIG. 7 is a diagram explaining processing performed by the magnetic resonance imaging apparatus according to the third embodiment.

FIG. 6 is a diagram showing an example of a screen displayed by a magnetic resonance imaging apparatus according to the third embodiment.

In FIG. 6, the image 1a and the image 1b are locator images generated on the basis of the first imaging imaged including the knee part. The image 1a is a sagittal image, and the image 1b is a coronal image. A feature point 30a, a feature point 30b, a feature point 30c, a feature point 30d, a feature point 31a, a feature point 31b, a feature point 31c, and a feature point 31d are feature points for calculating how the knee twists. As similar to FIG. 3, the straight line 10b is a straight line that represents the longitudinal direction of the thighbone in the first imaging. The straight line 10c is a straight line representing the longitudinal direction of the tibia in the first imaging. The straight line 10a is a straight line that represents the longitudinal direction of the thighbone being suitable for the second imaging. The straight line 10d is a straight line representing the longitudinal direction of the thighbone being suitable for the second imaging. The straight line 10a and the straight line 10d are, for example, straight lines estimated on the basis of imaging previously performed on the subject P. The display region 2 is a region that displays a message to the user.

FIG. 1 is a diagram explaining processing performed by the magnetic resonance imaging apparatus according to the third embodiment. FIG. 7 is a schematic diagram for explaining knee twisting. A leg 40c represents a leg and a thigh 40d represents a thigh. A knee joint 40a represents a knee joint that connects the leg 40c and the thigh 40d. In addition, a hip joint 40b represents a hip joint that is a joint in a torso side. As illustrated in FIG. 7, when the thigh 40d rotates to be arranged in a different position from before, the position of the knee joint 40a shifts a little in conjunction with the thigh 40d. When the position of the knee joint 40a shifts a little, accordingly, for example, the position of the leg 40c shifts a little. In this way, due to the rotation of the thigh 40d, a degree of freedom is generated in the knee joint. 40a and the leg 40c. In the third embodiment, reproducibility of the image is prevented from decreasing due to the generation of the degree of freedom.

With reference to the flowchart in FIG. 2 again, first, the sequence control circuitry 120 performs the first imaging on the subject P as similar to the embodiments described above (step S100). Following describes a case where the imaging is performed including the knee part as the body part to be imaged. However, the embodiment is not limited to this case. For example, the embodiment can be similarly applied to other joint parts.

Subsequently, the processing circuitry 150 acquires the first position that is the position of the subject P in the first imaging (step S110). In the third embodiment, the position of the subject P refers to an angle of knee twisting of the subject P, that is, an angle of twisting of the thigh 40d and the leg 40c. Note that the first imaging is performed including the thigh 40d that includes a first bone and the leg 40c that includes a second bone, on the subject P.

In the third embodiment, the processing circuitry 150 calculates the straight line 10b that represents the longitudinal direction of the thighbone and the straight line 10c that represents the longitudinal direction of the tibia, on the basis of the image 1a by the generation function 136.

The processing circuitry 150 extracts a plurality of feature points such as the feature points 30a, 30b, 30c, 30d, 31a, 31b, 31c, and 31d by using a predetermined technique such as the slice-alignment method of knee, for example, from the image 1a that is a sagittal image and the image 1b that is a coronal image, by the generation function 136.

Subsequently, the processing circuitry 150 calculates position shift of each feature point around a bone, on the basis of the calculated straight line 10b, the straight line 10c, the extracted feature point. 30a, and the like, by the generation function 136. Then the processing circuitry 150 calculates an angle of knee twisting (twist between the thigh 40d and the leg 40c) from the degree of the calculated position shift.

Subsequently, the processing circuitry 150 estimates and acquires the second position that is the position of the subject P being suitable for the second imaging performed after the first imaging (step S120). Particularly, the processing circuitry 150, for example, calculates the angle of knee twisting in the imaging previously performed on the basis of the imaging previously performed on the subject P, as similarly to step S110, by the generation function 136. Note that the second imaging is performed including the thigh 40d that includes the first bone and the leg 40c that includes the second bone, on the subject P.

For example, the processing circuitry 150 calculates the straight line 10a that represents the longitudinal direction of the thighbone and the straight line 10d that represents the longitudinal direction of the tibia, on the basis of the imaging previously performed, by the generation function 136.

In addition, the processing circuitry 150 extracts a plurality of feature points from imaging previously performed, by the generation function 136. Subsequently, the processing circuitry 150 calculates position shift of each feature point around the bone, on the basis of the calculated straight line 10a, the straight line 10d, the extracted feature points, and the like, by the generation function 136. Then the processing circuitry 150 calculates an angle of knee twisting (twist between the thigh 40d and the leg 40c) from the degree of the calculated position shift.

The processing circuitry 150 determines whether the difference between the first position and the second position is within the acceptable range, by the determination function 137 (step S130). That is, the processing circuitry 150, for example, determines whether the difference between the angle of twisting of the thigh 40d and the leg 40c in the first imaging, and the angle of twisting of the thigh 40d and the leg 40c in the imaging previously performed is within the acceptable range, by the determination function 137.

When the processing circuitry 150 determines that the difference between the first position and the second position is within the acceptable range, by the determination function 137 (Yes at step S130), the correction of knee twisting is not necessary. Thus, the processing proceeds to step S180 and the processing circuitry 150 stores the current position as the setting information. After that the sequence control circuitry 120 performs the second imaging on the subject P in step S190.

On the other hand, when the processing circuitry 150 determines that the difference between the first position and the second position is not within the acceptable range, by the determination function 137 (Ho at step S130), the processing proceeds to step S140.

In step S140, the processing circuitry 150 generates the correction information (the supporting information) on the basis of the difference between an angle of twisting of the thigh 40d and the leg 40c in the first imaging and an angle of twisting of the thigh 40d and the leg 40c in the imaging previously performed, by the generation function 135. In other words, the processing circuitry 150 generates the correction information (the supporting information) on the basis of the difference between the angle of twisting of the first bone (thigh 40d) with respect to the second bone (leg 40c) in the image 1a generated on the basis of the first imaging, and the angle of twisting of the first bone with respect to the second bone that the subject P is supposed to keep in the second imaging, by the generation function 136 (step S140). The angle of twisting of the first bone with respect to the second bone is an angle of twisting calculated on the basis of predetermined feature points extracted from the image 1a and the image 1b generated on the basis of the first imaging.

For example, the processing circuitry 150 generates the correction information (the supporting information) that "It is desirable to turn the thigh 40d inside by about 10°" by the generation function 136. In addition, for example, the processing circuitry 150 generates the correction information (the supporting information) that "It is desirable to turn the leg 40c outside by about 10°" by the generation function 136.

Subsequently, the processing circuitry 150 causes the display 135 to display the information generated by the processing circuitry 150 by using the generation function 136 in step S140, by the control function 133 (step S150). For example, as illustrated in FIG. 6, the processing circuitry 150 causes the display region 2 of the display 135 to display a message that "Comparing to the previous imaging, knee twisting has been detected. Turn the thigh inside by about 10°. Turn the leg outside by about 10°" on the basis of the correction information (the supporting information) that "It is desirable to turn the thigh 40d inside by about 10°" and the correction information (the supporting information) that "It is desirable to turn the leg 40c outside by about 10°", by the control function 133.

Note that the embodiment is not limited to a case where the second position is acquired on the basis of the imaging previously performed. For example, the second position may be estimated on the basis of the statistical data such as know-hows.

As described above, the magnetic resonance imaging apparatus 100 according to the third embodiment performs setting for, for example, knee twisting. For example, knee twisting is hard to see at a glance but affects to, for example, reproducibility of the image in follow-up. By using the magnetic resonance imaging apparatus 100 according to the embodiment, appropriate setting for knee twisting can be performed and the image quality becomes stable.

Fourth Embodiment

In a fourth embodiment, with reference to the flowchart in FIG. 2 again and with reference to FIG. 8, a case where setting for a direction of the subject to the static magnetic field is performed on the basis of the locator image will be described. Note that, in the flowchart in FIG. 2, also in the fourth embodiment, processing of step S160 to step S190 is similar processing to that in the first embodiment. Thus, description for these steps will be omitted.

Figure 8:
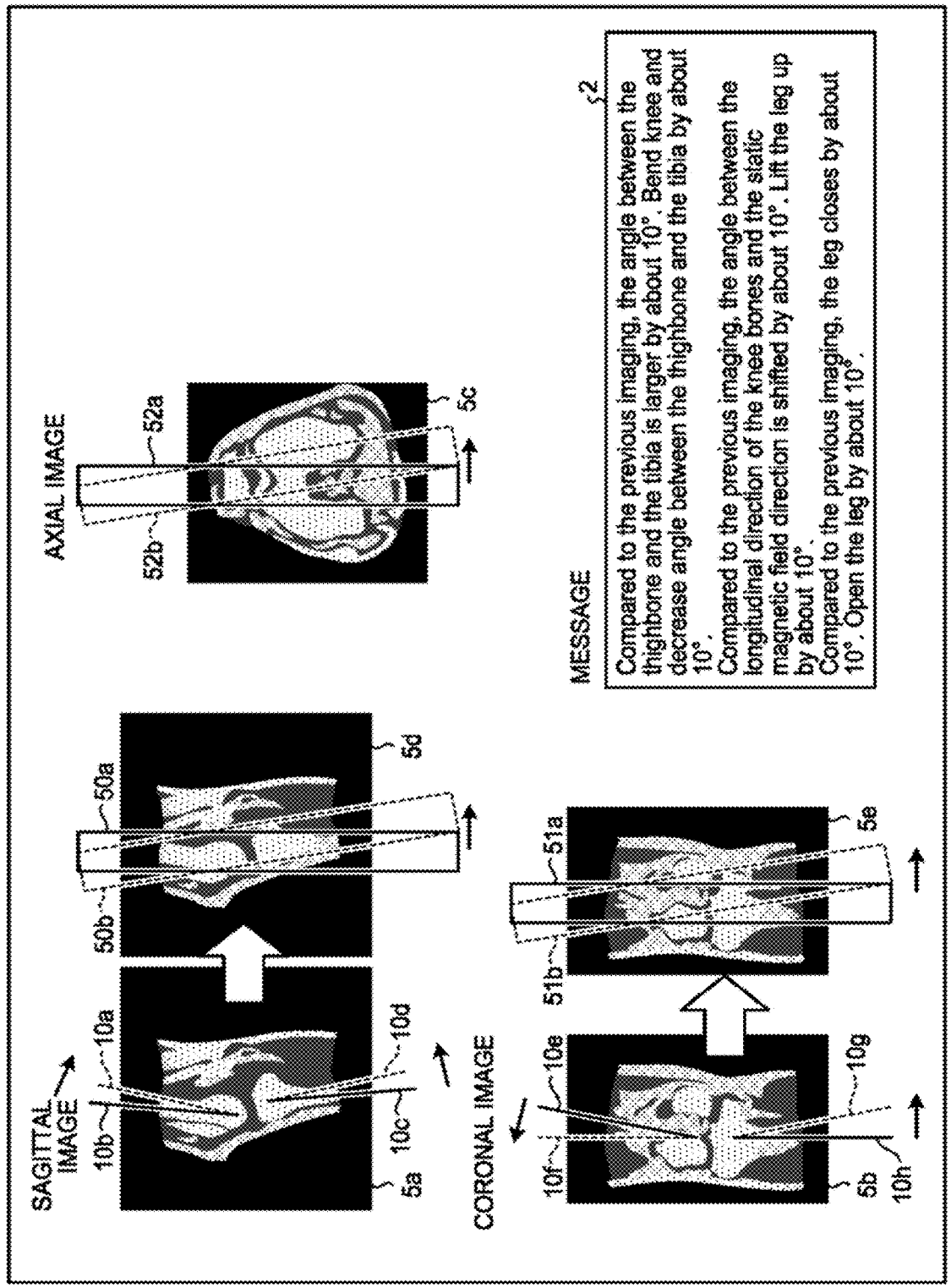
FIG. 8 is a diagram showing an example of a screen displayed by a magnetic resonance imaging apparatus according to a fourth embodiment.

FIG. 8 is a diagram showing an example of a screen displayed by a magnetic resonance imaging apparatus according to the fourth embodiment.

Figure 9:
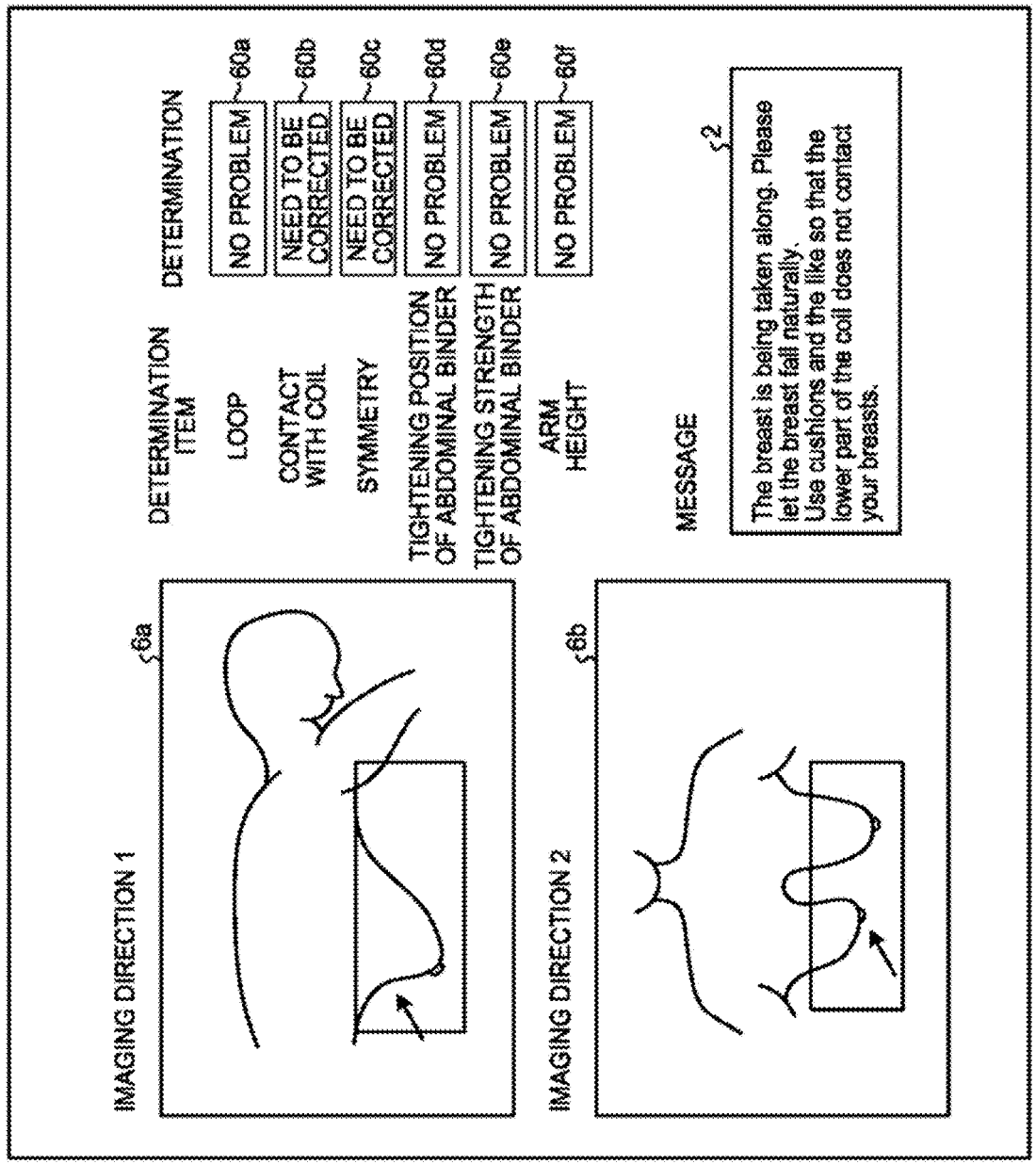
FIG. 9 is a diagram showing an example of a screen displayed by a magnetic resonance imaging apparatus according to a fifth embodiment.

In FIG. 9, a sagittal image 5a, a coronal image 5b, and an axial image 5c are locator images generated on the basis of the first imaging imaged including the knee part. The sagittal image 5a is a sagittal image. The coronal image 5b is a coronal image. The axial image 5c is an axial image. In addition, a sagittal image 5d is the same medical image as the sagittal image 5a other than annotation information. A coronal image 5e is the same medical image as the coronal image 5b other than the annotation information.

The straight line 10b displays on the sagittal image 5a the straight line that represents the longitudinal direction of the thighbone in the first imaging. The straight line 10c displays on the sagittal image 5a the straight line that represents the longitudinal direction of the tibia in the first imaging. A straight line 10e displays on the coronal image 5b the straight line that represents the longitudinal direction of the thighbone in the first imaging. A straight line 10h displays on the coronal image 5b the straight line that represents the longitudinal direction of the tibia in the first imaging.

The straight line 10a displays on the sagittal image 5a the straight line that represents the longitudinal direction of the thighbone being suitable for the second imaging. The straight line 10d displays on the sagittal image 5a the straight line that represents the longitudinal direction of the tibia being suitable for the second imaging. A straight line 10f displays on the coronal image 5b the straight line that represents the longitudinal direction of the thighbone being suitable for the second imaging. A straight line 10g displays on the coronal image 5b the straight line that represents the longitudinal direction of the tibia in the second imaging.

A rectangle 50a is a rectangle that represents on the sagittal image 5a a direction of the knee to the static magnetic field in the first imaging. A direction of a long side of the rectangle 50a represents on the sagittal image 5d a direction of the entire knee. Similarly, a rectangle 51a and a rectangle 52a are rectangles that represent on the coronal image 5b and the axial image 5c, respectively, the direction of the knee to the static magnetic field in the first imaging. Directions of long sides of the rectangle 51a and the rectangle 52a represent on the coronal image 5e and the axial image 5c, respectively, a direction of the entire-knee, that is, an average longitudinal direction of the bone.

The display region 2 is a region that displays a message to the user.

With reference to the flowchart in FIG. 2 again, first, the sequence control circuitry 120 performs the first imaging on the subject P as similar to the embodiments described above (step S100). Following describes a case where imaging is performed including the knee part as the body part to be imaged. However, the embodiment is not limited to this case. For example, the embodiment can foe similarly applied to other parts.

Subsequently, the processing circuitry 150 acquires the first position that is the position of the subject P in the first imaging (step S110). In the fourth embodiment, the position of the subject P refers to the direction of the entire knee of the subject P to the direction of the static magnetic field, that is, the average longitudinal direction of the bone. For example, in FIG. 6, the average longitudinal direction of the bone is the direction of the long side of the rectangle 50a, the direction of the long side of the rectangle 51a, and the direction of the long side of the rectangle 52a.

The processing circuitry 150 acquires, for example, on the sagittal image 5a the straight line 10b that represents the longitudinal direction of the thighbone, and the straight line 10c that represents the longitudinal direction of the tibia, by the generation function 136. The processing circuitry 150 acquires, for example, on the coronal image 5b the straight line 10e that represents the longitudinal direction of the thighbone, and the straight line 10h that represents the longitudinal direction of the tibia, by the generation function 135.

Subsequently, the processing circuitry 150 calculates the average longitudinal direction of the bone on the sagittal image 5a on the basis of the straight line 10b and the straight line 10c by the generation function 136. Such status is illustrated in, for example, the sagittal image 5d. In the sagittal image 5d, the direction of the long side of the rectangle 50a corresponds to the direction of the entire knee, that is, the average longitudinal direction of the bone. The processing circuitry 150 calculates the average longitudinal direction of the bone on the coronal image 5b on the basis of the straight line 10e and the straight line 10h by the generation function 136. Such status is illustrated in, for example, the coronal image 5e. In the coronal image 5e, the direction of the long side of the rectangle 51a corresponds to the direction of the entire knee, that is, the average longitudinal direction of the bone. In addition, the processing circuitry 150 calculates the average longitudinal direction of the bone on the axial image 5c by the generation function 136. In the axial image 5c, the direction of the long side of the rectangle 55a corresponds to the direction of the entire knee, that is, the average longitudinal direction of the bone.

Subsequently, the processing circuitry 150 acquires the second position that is the position of the subject P being suitable for the second imaging performed after the first imaging (step S120).

Particularly, the processing circuitry 150, for example, acquires on the sagittal image related to the imaging previously performed the straight line 10a that represents the longitudinal direction of the thighbone and the straight line 10d that represents the longitudinal direction of the tibia, by the generation function 136. The processing circuitry 150, for example, acquires on the coronal image related to the imaging previously performed the straight line 10f that represents the longitudinal direction of the thighbone, and the straight line 10g that represents the longitudinal direction of the tibia, by the generation function 136.

Subsequently, the processing circuitry 150 calculates the average longitudinal direction of the bone on the sagittal image related to the imaging previously performed on the basis of the straight line 10a and the straight line 10d, by the generation function 136. Such status is illustrated in, for example, the sagittal image 5d. In the sagittal image 5d, the direction of the long side of a rectangle 50b represents the direction of the entire knee being suitable for the second imaging, that is, the average longitudinal direction of the bone, on a sagittal surface. The processing circuitry 150 calculates the average longitudinal direction of the bone on the coronal image related to the imaging previously performed on the basis of the straight line 10f and the straight line 10g by the generation function 136. Such status is illustrated in, for example, the coronal image 5e. In the coronal image 3e, the direction of the long side of a rectangle 51b represents the direction of the entire knee being suitable for the second imaging, that is, the average longitudinal direction of the bone on a coronal surface. In addition, the processing circuitry 150 calculates the average longitudinal direction of the bone on the axial image related to the imaging previously performed by the generation function 136. In the axial image 5c, the direction of the long side of a rectangle 52b represents the direction of the entire knee being suitable for the second imaging, that is, the average longitudinal direction of the bone on an axial surface.

The processing circuitry 150 determines whether the difference between the first position and the second position is within the acceptable range, by the determination function 137 not illustrated (step S130).

When the processing circuitry 150 determines that the difference between the first position and the second position is within the acceptable range, by the determination function 137 (Yes at step S130), the correction of the position of the subject P to the static magnetic field is not necessary. Thus, the processing proceeds to step S130 and the processing circuitry 150 stores the current position as the setting information. After that the sequence control circuitry 120 performs the second imaging on the subject P in step S190.

On the other hand, when the processing circuitry 150 determines that the difference between the first position and the second position is not within the acceptable range, by the determination function 137 (No at step S130), the processing proceeds to step S140.

In step S140, the processing circuitry 130 generates the correction information (the supporting information) that is information for aligning the direction of the knee to the static magnetic field on the basis of the difference between the direction of the long side of the rectangle 50*a* and the direction of the long side of the rectangle 50*b* in the sagittal image 5*d*, by the generation function 136. In addition, the processing circuitry 150 generates the correction information (the supporting information) that is information for aligning the direction of the knee to the static magnetic field on the basis of the difference between the direction of the long side of the rectangle 51*a* and the direction of the long side of the rectangle 51*b* in the coronal image 5*e*, by the generation function 136. In addition, the processing circuitry 150 generates the correction information (the supporting information) that is information for aligning the direction of the knee to the static magnetic field on the basis of the difference between the direction of the long side of the rectangle 52*a* and the direction of the long side of the rectangle 52*b* in the axial image 5*c*, by the generation function 136. For example, the processing circuitry 150 generates the correction information (the supporting information) that "It is desirable to bend the knee and decrease the angle between the thighbone and the tibia by about 10°", "It is desirable to lift up the leg by about 10°", "It is desirable to open the leg by about 10°", or the like by the generation function 136. That is, the processing circuitry 150 detects the longitudinal direction of the bone included in the sagittal image 5*a*, the coronal image 5*b*, and the axial image 5*c* that are images acquired on the basis of the first imaging, and generates the correction information (the supporting information) that is information for aligning the direction of the subject P to the static magnetic field on the basis of the detected longitudinal direction of the bone, by the generation function 136.

Subsequently, the processing circuitry 130 causes the display 135 to display the information generated by the processing circuitry 150 by using the generation function 136 in step S140, by the control function 133 (step S150). For example, the processing circuitry 150 causes the display region 2 of the display 135 to display a message such as "Comparing to previous imaging, the angle between the thighbone and the tibia is larger by about 10°. Bend the knee and decrease the angle between the thighbone and the tibia by about 10°. Comparing to the previous imaging, the angle between the longitudinal direction of the knee bones and the static magnetic field direction is shifted by about 10°. Lift up the leg by about substantially 10°. Comparing to the previous imaging, the leg closes by about 10°, open the leg by about 10°", on the basis of the correction function described above, by the control function 133.

Note that the embodiment is not limited to a case where the second position is acquired on the basis of the imaging previously performed. The second position may be estimated based on statistical data such as know-hows.

As described above, the magnetic resonance imaging apparatus 100 according to the fourth embodiment performs the setting for the direction of the subject to the static magnetic field by using, for example the locator image.

Thereby, the image quality becomes stable.

Fifth Embodiment

For the embodiments described above, a case of performing a knee examination has been described. In a fifth embodiment, with reference to the flowchart in FIG. 2 again and with reference to FIG. 5, a case of performing a breast will be described. Note that, in the flowchart in FIG. 2, processing in step S160 to step S150 is similar processing to that in the first embodiment. Thus, description for these steps will be omitted.

FIG. 9 is a diagram showing an example of a screen displayed by a magnetic resonance imaging apparatus according to the fifth embodiment.

In FIG. 9, an image 6*a* and an image 6*b* are locator images generated on the basis of the first imaging imaged including the breast part. The image 6*a* is an image imaged from first imaging direction. On the other hand, the image 6*b* is an image imaged from a second imaging direction. The display region 2 is a region that displays a message to the user. A display region 60*a* is a display region that displays information representing whether a loop is formed in the subject P. Generation of a loop refers to, for example, that a breast of the subject P is short circuited and a closed loop is formed. When the closed loop exists in a strong magnetic field, for example, an eddy current is generated and causes burns. Thus, it is desirable to check if a loop is formed. In addition, a display region 60*b* is a display region that displays information representing whether the breast of the subject P contacts with a coil. A display region 60*c* is a display region that displays information representing whether the breasts of the subject P are arranged symmetrically. A display region 60*d* is a display region that displays information representing whether a tightening position of an abdominal binder is a normal position. A display region 60*e* is a display region that displays information representing whether tightening strength of the abdominal binder is within a range of normal values. A display region 60*f* is a region that displays information representing whether height of arms is within a range of normal values.

With reference to the flowchart in FIG. 2 again, first, the sequence control circuitry 120 performs the first imaging on the subject P as similar to that in the first embodiment (step S100).

Subsequently, the processing circuitry 150 acquires the first position that is the position of the subject P in the first imaging, by the generation function 136 (step S110). In the fifth embodiment, the position of the subject P typically refers to the position of the breast of the subject P. For example, the processing circuitry 150 acquires the tightening position of the abdominal binder by the generation function 136. In addition, the processing circuitry 150 acquires the height of the arm by the generation function 136.

In addition, the processing circuitry 150 may acquire other parameters in addition to that, by the generation function 136. In this case, the processing circuitry 150, for example, acquires the tightening strength of the abdominal binder, by the generation function 136. In addition, the processing circuitry 150, for example, acquires information representing whether the breasts of the subject P are arranged symmetrically, by the generation function 136. In addition, the processing circuitry 150, for example, acquires information representing whether the loop is formed in the subject P, by the generation function 136. In addition, the processing circuitry 150, for example, causes information representing whether the breast of the subject P contacts with the coil to be displayed, by the generation function 136.

Subsequently, the processing circuitry 150 estimates and acquires the second position that is the position of the subject P being suitable for the second imaging performed after the first imaging, or the like, on the basis of, for example, know-hows, statistical data, or past imaging of the subject P (step S120).

For example, the processing circuitry 150 acquires the tightening position of the abdominal binder that is suitable for the second imaging, by the generation function 136. In addition, the processing circuitry 150 acquires the height of the arm that is suitable for the second imaging, by the generation function 136.

In addition, the processing circuitry 150 may acquire other parameters in addition to this, by the generation function 136. In this case, for example, the processing circuitry 150 acquires the tightening strength of the abdominal binder that is suitable for the second imaging, by the generation function 136.

In the processing corresponding to step S130, the processing circuitry 150 determines whether the current setting is within the acceptable range, by the determination function 137 (step S130).

For example, the processing circuitry 150 determines as "need to be corrected" when a loop is formed in the subject P, and as "no problem" when no loop is formed in the subject P, for a determination item of "loop", by the determination function 137. The processing circuitry 150 determines as "need to be corrected" when the breast of the subject P contacts with the coil, and as "no problem" when the breast of the subject P does not contact with the coil, for a determination item of "contacting with coil", by the determination function 137. The processing circuitry 150 determines as "no problem" when the breasts of the subject P are arranged symmetrically, and as "need to be corrected" when the breasts of the subject P are not arranged symmetrically, for a determination item of "symmetry", by the determination function 137. The processing circuitry 150 determines as "no problem" when a difference between the tightening position of the abdominal binder acquired in step S110, and the tightening position of the abdominal binder of the subject P that is suitable for the second imaging acquired in step S120, is less than a predetermined threshold, and as "need to be corrected" when the difference is the predetermined threshold or more, for a determination item of "tightening the position of the abdominal binder" by the determination function 137. The processing circuitry 150 determines as "no problem" when a difference between the tightening strength of the abdominal binder acquired in step S110 and the tightening strength of the abdominal binder of the subject P, that is suitable for the second imaging acquired in step S120, is less than a predetermined threshold, and as "need to be corrected" when the difference is the predetermined threshold or more, for a determination item of "tightening the strength of abdominal binder", by the determination function 137. The processing circuitry 150 determines as "no problem" when a difference between the height of the arm acquired in step S110, and the height of the arm of the subject P, that is suitable for the second imaging acquired in step S120, is less than a predetermined threshold, and as "need to be corrected" when the difference is the predetermined threshold or more, for a determination item of "arm height", by the determination function 137.

The processing circuitry 150 causes the display 135 to display the determination result, by the control function 133. For example, the processing circuitry 150 causes the display region 50*a* to display the determination result for the determination item of "loop". In addition, the processing circuitry 150 causes the display region 60*b* to display the determination result for the determination item of "contacting with coil". In addition, the processing circuitry 150 causes the display region 60*c*, the display region 60*d*, the display region 60*e*, and the display region 60*f* to display the determination result for the determination items of "symmetry", "tightening the position of the abdominal binder", "tightening the strength of the abdominal binder", and "arm height", respectively.

Subsequently, the processing circuitry 150 determines that the current setting is within the acceptable range when determined as "no problem" for all of the determination items, by the determination function 137. In addition, the processing circuitry 150 determines that the current setting is not within the acceptable range when there is a determination item of "need to be corrected", by the determination function 137.

When the processing circuitry 150 determines that the current setting is within the acceptable range, by the determination function 137 (Yes at step S130), the correction of the position of the breast is not necessary. Thus, the processing proceeds to step S180, and the processing circuitry 150 stores the current position as the setting information. After that the sequence control circuitry 120 performs the second imaging on the subject P by step S190.

On the other hand, when the processing circuitry 150 determines that the current setting is not within the acceptable range, by the determination function 137 (No at step S130), the processing proceeds to step S140.

The processing circuitry 150 generates information representing a difference between the first position that is the position of the subject P in the first imaging and the second position that is the position of the subject P that is suitable for the second imaging performed after the first imaging (correction information) on the basis of the image 6*a* and the image 6*b* generated on the basis of the first imaging performed on the subject P and on the second position estimated as described above by the estimation function 138, by the generation function 135. For example, the processing circuitry 150 generates the correction information (the supporting information) that "The breast is being taken along. Please let the breast fall naturally", by the generation function 136. In addition, for example, the processing circuitry 150 generates the correction information (the supporting information) that "Use cushions and the like so that the lower part of the coil does not contact your breasts", by the generation function 136.

Subsequently, the processing circuitry 150 causes the display 135 to display the information generated by the processing circuitry 150 by using the generation function 136 in step S140, by the control function 133 (step S150). For example, as illustrated in FIG. 9, the processing circuitry 150 causes the display region 2 of the display 135 to display a message that "The breast is being taken along. Please let the breast fall naturally" on the basis of the correction information (the supporting information) that "Use cushions and the like so that the lower part of the coil does not contact your breasts", by the control function 133. In addition, for example, the processing circuitry 150 causes the display region 2 of the display 135 to display a message that "Use cushions and the like so that the lower part of the coil does not contact our breasts" on the basis of the correction information (the supporting information) that "Use cushions and the like so that the lower part of the coil does not contact your breasts", by the control function 133.

Note that the embodiment is not limited to a case where the second position is acquired on the basis of the imaging previously performed. For example, the second position may be estimated on the basis of the statistical data such as know-hows.

As described above, the magnetic resonance imaging apparatus 100 according to the fifth embodiment performs the setting of the position of the breast in the breast examination by using, for example, the locator image. By using the magnetic resonance imaging apparatus 100 according to the fifth embodiment, the image quality can be stable.

Sixth Embodiment

For a sixth embodiment, with reference to the flowchart in FIG. 2 again, and with reference to FIG. 10, a case where a head part examination and a neck part examination are performed will be described. In the magnetic resonance imaging of the head and neck part, for example, drawing of the CSF is important. However, easiness of the CSF to flow is different depending on the neck angle. In other words, depending on the degree of neck bending of the subject P, easiness of the CSF to flow varies, and thereby the image looks different. Accordingly, it is desirable to unify the degree of neck bending of the subject P for each imaging. The magnetic resonance imaging apparatus 100 according to the sixth embodiment performs setting for the degree of neck bending of the subject P to make the image quality in the magnetic resonance imaging of the head and the neck part stable.

Note that, in the flowchart in FIG. 2, processing in step S160 to step S190 is similar processing to that in the first embodiment. Thus, description for these steps will be omitted.

Figure 10:
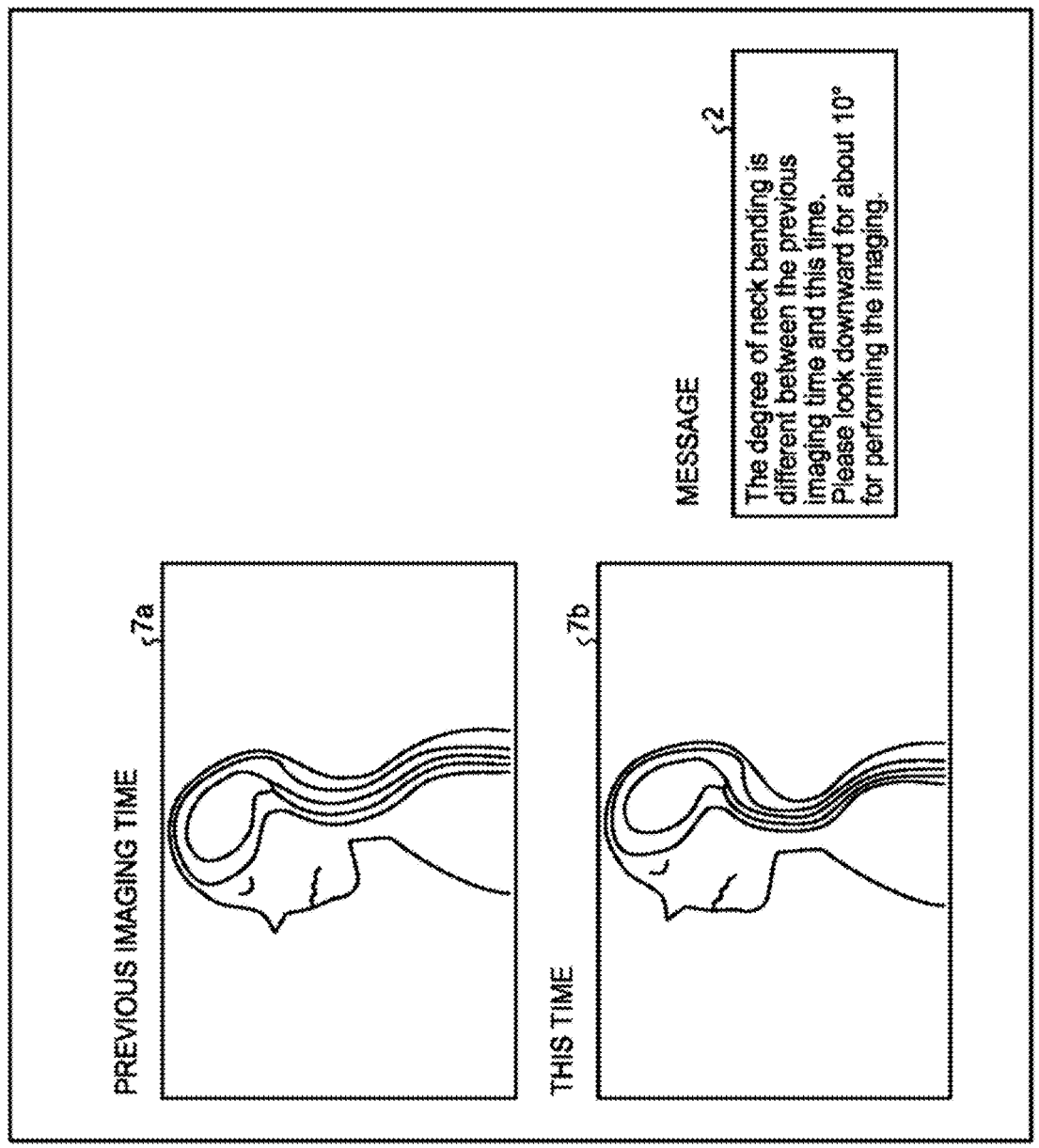
FIG. 10 is a diagram showing an example of a screen displayed by a magnetic resonance imaging apparatus according to a sixth embodiment.

FIG. 10 is a diagram showing an example of a screen displayed by the magnetic resonance imaging apparatus according to the sixth embodiment.

In FIG. 10, an image 7b is a locator image generated on the basis of the first imaging imaged including a head and neck part. On the other hand, an image 7a is an image generated on the basis of imaging previously imaged including the head and neck part. The display region 2 is a region that displays a message to the user.

With reference to the flowchart in FIG. 2 again, first, the sequence control circuitry 120 performs the first imaging on the subject P as similar to the first embodiment (step S100).

Subsequently, the processing circuitry 150 acquires the first position that is the position of the subject P in the first imaging, by the generation function 136 (step S110). In the sixth embodiment, the position of the subject P refers to, for example, the degree of neck bending of the subject P. In this case, the processing circuitry 160 calculates the curvature of a curve of a spinal canal near the cervical vertebrae or the curvature of a curve of the cervical vertebrae by performing predetermined image processing, and acquires the degree of neck bending of the subject P in the image 7b acquired on the basis of the first imaging on the basis of the calculated curvature, by the generation function 136.

The cerebrospinal fluid (CSF), for example, is represented as a high signal in the T2 emphasized image and a low signal in the T1 emphasized image. Thus, the processing circuitry 150 performs image processing for performing binarization processing to the image acquired from the first imaging and calculates, for example, the degree of neck bending of the subject P on the basis of the binarized image, by the generation function 136.

Subsequently, the processing circuitry 150 estimates and acquires the second position that is the position of the subject P being suitable for the second imaging performed after the first imaging, or the like, on the basis of, for example, the past imaging (step S120).

For example, the processing circuitry 150 acquires the degree of neck bending that the subject P is supposed to keep in the second imaging, as the second position, by the generation function 136.

Subsequently, the processing circuitry 150 determines whether the current setting is within the acceptable range, by the determination function 137 (step S130).

When the processing circuitry 150 determines that the current setting is within the acceptable range, by the determination function 137 (Yes at step S130), the correction of the degree of neck bending is not necessary. Thus, the processing proceeds to step S180, and the processing circuitry 150 stores the current position as the setting information. After that the sequence control circuitry 120 performs the second imaging on the subject P in step S190.

On the other hand, when the processing circuitry 150 determines that the current setting is within the acceptable range, by the determination function 137 (No at step S130), the processing proceeds to step S140.

Subsequently, the processing circuitry 150 generates the correction information (the supporting information) on the basis of the difference between the degree of neck bending of the subject P in the image 7b acquired on the basis of the first imaging, and the degree of neck, bending that the subject P is supposed to keep in the second imaging, by the generation function 136 step S140). For example, the processing circuitry 150 generates the correction information (the supporting information) that. "It is desirable to look downward for about 10° for performing the imaging", by the generation function 136.

Subsequently, the processing circuitry 150 causes the display 135 to display the information generated by the processing circuitry 150 by using the generation function 136 in step S140, by the control function 133 (step S150). For example, as illustrated in FIG. 10, the processing circuitry 150 causes the display region 2 of the display 135 to display a message that "The degree of neck bending is different between the previous imaging time and this time. Look downward for about 10° for performing the imaging." on the basis of the correction information (the supporting information) that "It is desirable to look downward for about 10° for performing the imaging", by the control function 133.

Note that the embodiment is not limited to a case where the second position is acquired on the basis of the imaging previously performed. For example, the second position may be estimated on the basis of statistical data such as know-hows.

As described above, the magnetic resonance imaging apparatus 100 according to the sixth embodiment performs the setting of the degree of neck bending in the head and neck part by using, for example, the locator image. By performing the imaging so that the degree of neck bending is stable, the easiness of the CSF to flow is similar degree for each time. Thus, the image quality can be stable.

Seventh Embodiment

For a seventh embodiment, with reference to the flowchart in FIG. 2 again, and with reference to FIG. 11, a case where setting of the arm position is performed will be described. In the magnetic resonance imaging of the spine or the abdomen, it is suggested that, for example, by lifting the arm position to the abdomen side by a predetermined distance, for example, 8 cm, from a back side, for example, the B1 (high frequency magnetic field) uniformity near the spine can increase. Accordingly, if is desirable that, in the magnetic resonance imaging of the spine or the abdomen, the arm position is, for example, a predetermined height or more, for increasing the B1 uniformity of the imaging object. The magnetic resonance imaging apparatus 100 according to the seventh embodiment performs the setting of the arm height in the magnetic resonance imaging of the spine or the abdomen to make the B1 uniformity stable.

Note that, in the flowchart in FIG. 2, processing in step S100 to step S150 is similar processing to that in the first embodiment. Thus, description for these steps will be omitted.

Figure 11:
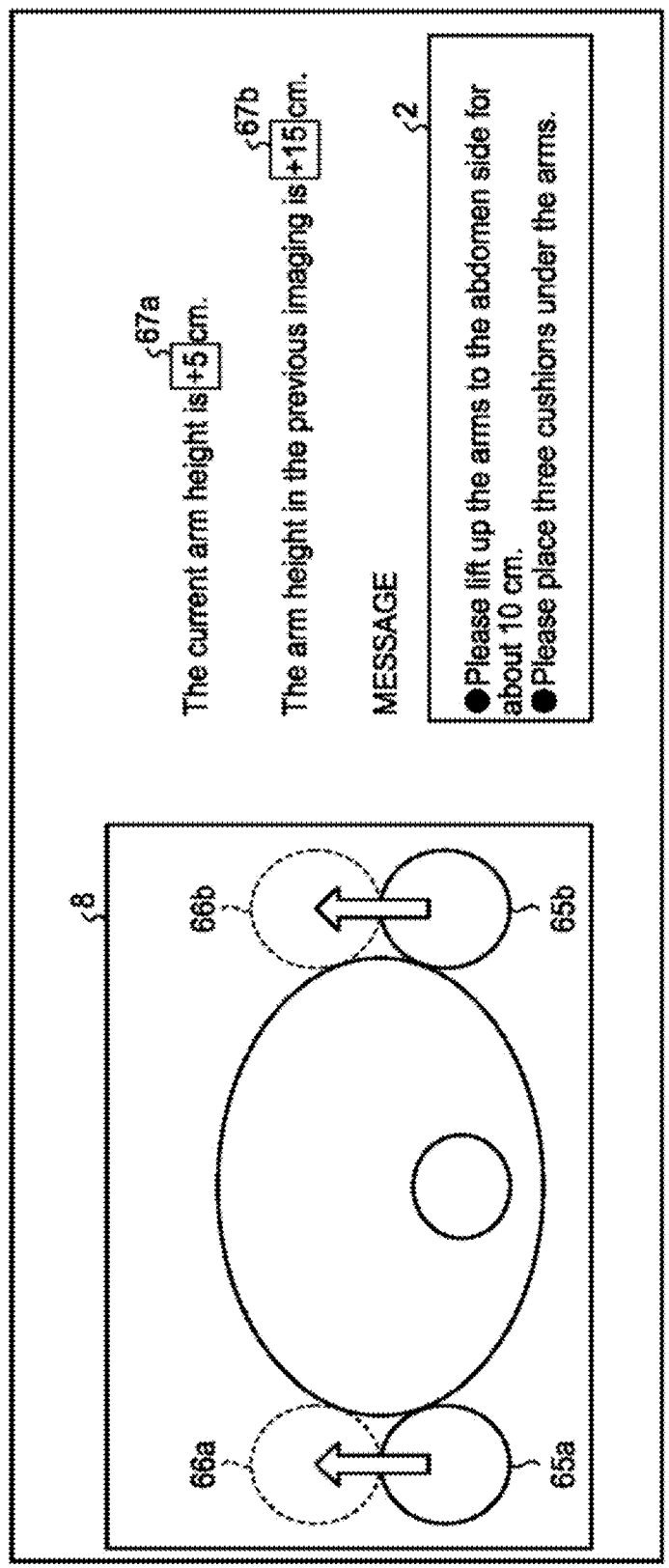
FIG. 11 is a diagram showing an example of a screen displayed by a magnetic resonance imaging apparatus according to a seventh embodiment.

FIG. 11 is a diagram showing an example of a screen displayed by the magnetic resonance imaging apparatus according to the seventh embodiment.

In FIG. 11, an image 8 is a locator image generated on the basis of the first imaging imaged including the abdomen, and the like of the subject. An arm 65a and an arm 65b represent arms of the subject in the first imaging. An arm 66a and an arm 66b represent positions of arms of the subject that is suitable for the second imaging. The display region 2 is a region that represents a message to the user. A display region 67a is a display region that displays the current (first imaging time) arm height with a couch position as a reference. A display region 67b is a display region that displays the arm height in the previous imaging or the arm height of the subject that is suitable for the second imaging, with the couch position as a reference.

With reference to the flowchart in FIG. 2 again, first, the sequence control circuitry 120 performs the first imaging on the subject P as similar to the first embodiment (step S100). The first imaging is performed including the arm part on the subject P.

Subsequently, the processing circuitry 150 acquires the first position that is the position of the subject P in the first imaging, by the generation function 136 (step S110). In the seventh embodiment, the position of the subject P refers to, for example, the height of the arm 65a and the arm 65b of the subject P. The processing circuitry 150 acquires the arm position of the subject in the image 8 acquired on the basis of the first imaging as the first position, by the generation function 136.

Subsequently, the processing circuitry 150 estimates and acquires the second position that is the position of the subject P being suitable for the second imaging performed after the first imaging, or the like, on the basis of, for example, the past imaging (step S120). In the seventh embodiment, the processing circuitry 150 acquires the arm position that the subject P is supposed to keep in the second imaging as the second position, by the generation function 136.

Subsequently, the processing circuitry 150 determines whether the current setting is within the acceptable range, by the determination function 137 (step S130).

When the processing circuitry 150 determines that the current setting is within the acceptable range, by the determination function 137 (Yes at step S130), the correction of the arm position is not necessary. Thus, the processing proceeds to step S180, and the processing circuitry 150 stores the current position as the setting information. After that the sequence control circuitry 120 performs the second imaging on the subject P in step S190.

On the other hand, when the processing circuitry 150 determines that the current setting is not within the acceptable range, by the determination function 137 (No at step S130), the processing proceeds to step S140.

Subsequently, the processing circuitry 150 generates the correction information (the supporting information) on the basis of a difference between the position of the arms 65a, 65b of the subject P in the image 8 acquired on the basis of the first imaging, and the position of the arms 66a, 66b that the subject P is supposed to keep in the second imaging, by the generation function 136 (step S140). For example, the processing circuitry 150 generates the correction information (the supporting information) that. "It is desirable to lift up the arms to the abdomen side for 10 cm" by the generation function 136. In addition, as another example, the processing circuitry 150 generates the correction information (the supporting information) that. "It is desirable to place three cushions under the arms" by the generation function 136.

Subsequently, the processing circuitry 150 causes the display 135 to display the information generated by the processing circuitry 150 by using the generation function 136 in step S140, by the control function 133 (step S150). For example, as illustrated in FIG. 11, the processing circuitry 150 causes the display region 2 of the display 135 to display a message that "Please lift up the arms to the abdomen side for about 10 cm" on the basis of the correction information (the supporting information) that "It is desirable to lift up the arms to the abdomen side for 10 era", by the control function 133. In addition, the processing circuitry 150 causes the display region 2 of the display 135 to display a message that "Please place three cushions under the arms" on the basis of the correction information (the supporting information) that "It is desirable to place three cushions under the arms" by the control function 133.

Note that the embodiment is not limited to a case where the second position is acquired on the basis of the imaging previously performed. For example, the second position may be estimated on the basis of the statistical data such as know-hows.

As described above, the magnetic resonance imaging apparatus 100 according to the seventh embodiment performs the setting of the arm position in the magnetic resonance imaging of the spine or the abdomen by using, for example, the locator image. Thereby, the B1 uniformity of the imaging object can be stable.

Eighth Embodiment

For the fourth embodiment, a case where the setting for the direction of the subject to the static magnetic field is performed has been described for a case of the knee part.

For an eighth embodiment, a case is similar to the fourth embodiment and is of performing setting for the direction of the subject to the static magnetic field. However, the eighth embodiment is different from the fourth embodiment in that the imaging part is a shoulder.

For the eighth embodiment, with reference to the flowchart in FIG. 2 again, and with reference to FIG. 12, a case where the setting for the direction of the shoulder to the static magnetic field is performed on the basis of the locator image will be described. Note that, in the flowchart in FIG. 2, also for the eighth embodiment, processing in step S160 to step S190 is similar processing to that in the first embodiment. Thus, description for these steps will be omitted.

Figure 12:
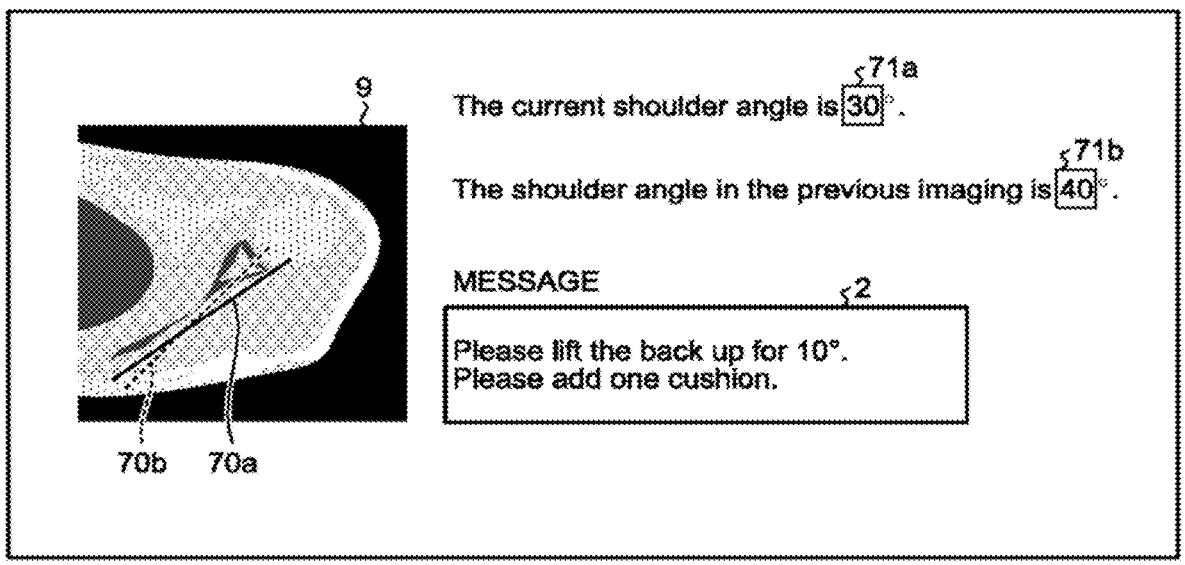
FIG. 12 is a diagram showing an example of a screen displayed by a magnetic resonance imaging apparatus according to an eighth embodiment.

FIG. 12 is a diagram showing an example of a screen displayed by a magnetic resonance imaging apparatus according to the eighth embodiment.

In FIG. 12, an image 5 is the locator image generated on the basis of the first imaging imaged including the shoulder part. A straight line 70a represents a straight line representing the longitudinal direction of the bone in the first imaging on the image 9. A straight line 70b represents the straight line representing the longitudinal direction of the bone that is suitable for the second imaging, on the image 9.

The display region 2 is a region that displays a message to the user. A display region 71a is a display region for displaying an angle of the shoulder in the first imaging. A display region 71b is a display region for displaying an angle of the shoulder that is suitable for the second imaging.

With reference to the flowchart in FIG. 2 again, first, the sequence control circuitry 120 performs the first imaging on the subject P as similar to the embodiments described above (step S100).

Subsequently, the processing circuitry 150 acquires the first position that is the position of the subject P in the first imaging (step S110). In the eighth embodiment, the position of the subject P refers to the direction of the overall direction of the subject P to the static magnetic field, that is, the average longitudinal direction of the bone. This is, for example, the direction of the straight line 70a in FIG. 12. The processing circuitry 150, for example, acquires the straight line 70a that represents the longitudinal direction of the bone in the image 9, by the generation function 136.

Subsequently, the processing circuitry 150 acquires the second position that is the position of the subject P being suitable for the second imaging performed after the first imaging (step S120). Particularly, the processing circuitry 150, for example, acquires the straight line 70b that represents the longitudinal direction of the bone in the sagittal image related to the imaging previously performed, by the generation function 136.

The processing circuitry 150 determines whether the difference between the first position and the second position is within the acceptable range, by the determination function 137 (step S130).

When the processing circuitry 150 determines that the difference between the first position and the second position is within the acceptable range, by the determination function 137 (Yes at step S130), the correction of the position of the subject P to the static magnetic field is not necessary.

Thus, the processing proceeds to step S180, and the processing circuitry 150 stores the current position as the setting information. After that the sequence control circuitry 120 performs the second imaging on the subject P in step S150.

On the other hand, when the processing circuitry 150 determines that the difference between the first position and the second position is not within the acceptable range, by the determination function 137 (No at step S130), the processing proceeds to step S140.

Subsequently, in step S140, the processing circuitry 150 generates the correction information (the supporting information) that is information for aligning the direction of the subject P to the static magnetic field on the basis of the straight line 70a and the straight line 70b, by the generation function 135. For example, the processing circuitry 150 generates the correction information (the supporting information) that "It is desirable to lift up the back for 10°" by the generation function 136. In addition, as another example, the processing circuitry 150 generates the correction information (the supporting information) that. "It is desirable to add one cushion", by the generation function 136.

Subsequently, the processing circuitry 150 causes the display 135 to display the information generated by the processing circuitry 150 by using the generation function 136 in step S140, by the control function 133 (step S150). For example, the processing circuitry 150 causes the display region 2 of the display 135 to display a message that "Please lift up the back, for 10°. Please add one cushion.", or the like on the basis of the correction information (the supporting information) described above, by the control function 133. In addition, the processing circuitry 150 may cause the display region 71a to display the current (first imaging time) angle of the shoulder, by the control function 133. In addition, the processing circuitry 150 may cause the display region 71b to display the angle of the shoulder in the previous imaging, by the control function 133.

Note that the embodiment is not limited to a case where the second position is acquired on the basis of imaging previously performed. For example, the second position may be estimated on the basis of the statistical data such as know-hows.

As described above, the magnetic resonance imaging apparatus 100 according to the eighth embodiment performs the setting of the direction of the shoulder to the static magnetic field by using, for example, the locator image. Thereby, the image quality becomes stable.

Ninth Embodiment

For ninth embodiment, with reference to the flowchart in FIG. 2 again, and with reference to FIG. 13, a case where setting of each element of the array coil is performed will be described.

Note that, in the flowchart in FIG. 2, processing in step S160 to step S190 is similar processing to that in the first embodiment. Thus, description for these steps will be omitted.

Figure 13:
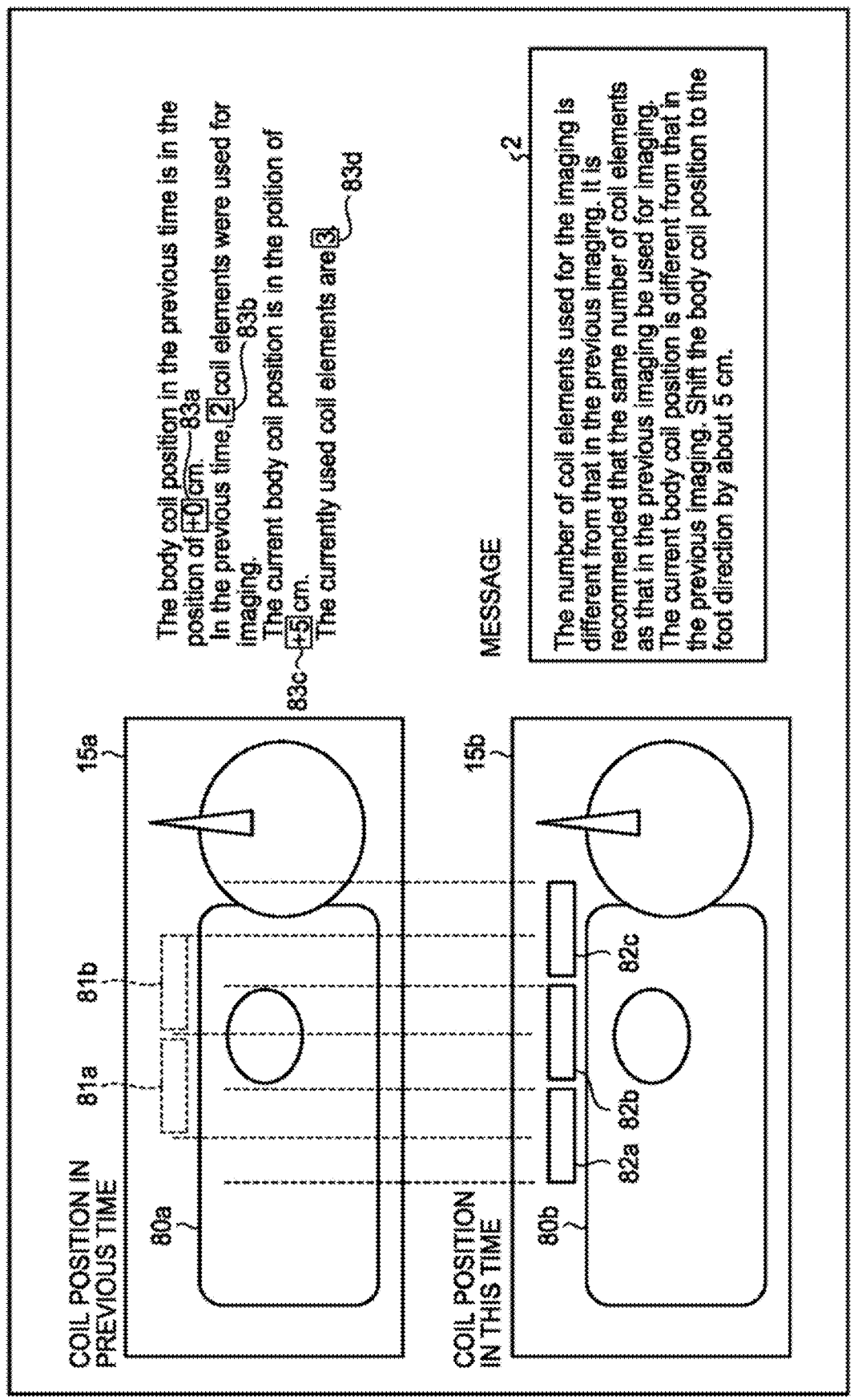
FIG. 13 is a diagram showing an example of a screen displayed by a magnetic resonance imaging apparatus according to a ninth embodiment.

FIG. 13 is a diagram showing an example of a screen displayed by a magnetic resonance imaging apparatus according to the ninth embodiment.

In FIG. 13, an image 15b is a locator image generated on the basis of the first imaging. A subject 80b represents a subject. Coil elements 82a, 82b, 82c represent respective coil elements of the array coil (body coil). On the other hand, an image 15a is an image generated on the basis of the imaging imaged in the previous time. A subject 80a represents a subject. Coil elements 81a, 81b represent coil elements of the array coil in the previous imaging. The display region 2 is a region that displays a message to the user. A display region 83c is a display region that displays a position of the body coil in the first imaging. A display region 83d is a display region that displays the total number of coil elements used in the first imaging. On the other hand, a display region 83a is a display region that displays a position of the body coil in the previous imaging. A display region 83b is a display region that displays the total number of coil elements in the previous imaging.

With reference to the flowchart in FIG. 2 again, first, the sequence control circuitry 120 performs the first imaging on the subject P as similar to the first embodiment (step S100).

The following describes a case where imaging is performed for a heart as the body part to be imaged. However, embodiments are not limited to this. The embodiment can be applied similarly to other body parts to be imaged.

Subsequently, the processing circuitry 150 acquires the first position that is the position of the subject P in the first imaging (step S110). In the ninth embodiment, the position of the subject P refers to a relative position of the subject P to the coil. Acquiring the relative position of the subject P to the coil is equal to acquiring a relative position of the coil with respect to the subject P. Thus, the operation in step S110 is equal to that the processing circuitry 150 acquires the position of the coil with respect to the subject P in the first imaging.

First, the processing circuitry 150 specifies the position of the heart from the image 15b that is the locator image generated on the basis of the first imaging, by the generation function 136. Subsequently, the processing circuitry 150 acquires the positions of the coil elements 82a, 82b, 62c, and the like of the body coil with the specified position of the heart as a reference, by the generation function 136. In addition, the processing circuitry 150 acquires the total number of coil elements used in the first imaging.

Subsequently, the processing circuitry 150 estimates and acquires the second position that is the position of the subject P being suitable for the second imaging performed after the first imaging (step S120). Particularly, the processing circuitry 150, for example, specifies the position of the heart from the image 15a generated on the basis of the imaging performed in the previous time on the subject P, as similar to step S110, by the generation function 186. Subsequently, the processing circuitry 150 acquires the positions of the coil elements 81a, 81b, and the like of the body coil in the previous imaging with the specified position of the heart as a reference, by the generation function 136. In addition, the processing circuitry 150 acquires the total number of coil elements used in the imaging performed in the previous time.

The processing circuitry 150 determines whether the current setting is within the acceptable range, by the determination function 137 (step S130). Particularly, the processing circuitry 150 determines as "no problem" when a difference between the position of the body coil in the first imaging and the position of the body coil in the imaging performed in the previous time is less than a predetermined threshold, and as "need to be corrected" when the difference is the predetermined threshold or more, for a determination item of "body coil position", by the determination function 137.

In addition, the processing circuitry 150 determines as "no problem" when the total number of coil elements of the body coil used in the first imaging and the total number of coil elements of the body coil in the previous imaging are the same numbers and as "need to be corrected" when the total numbers are different, for a determination item of "coil element number", by the determination function 137.

Subsequently, the processing circuitry 150 determines that the current setting is within the acceptable range when it is determined as "no problem" for both of the determination item of "body coil position" and the determination item of "coil element number", and that the current setting is not within the acceptable range when it is not determined as "no problem" for both of them, by the determination function 137.

When the processing circuitry 150 determines that the current setting is within the acceptable range, by the determination function 137 (Yes at step S130), the correction of the position of the coil is not necessary. Thus, the processing proceeds to step S180, and the processing circuitry 150 stores the current position as the setting information. After that the sequence control circuitry 120 performs the second imaging on the subject P in step S190.

On the other hand, when the processing circuitry 150 determines that the current setting is not within the acceptable range by the determination function 137 (No at step S130), the processing proceeds to step S140.

Subsequently, the processing circuitry 150 generates the correction information (the supporting information) on the basis of the difference between the position of the body coil estimated on the basis of the image 15b generated on the basis of the first imaging, and the position of the body coil being suitable for the second imaging, by the generation function 136 (step S140). In addition, the processing circuitry 150 generates the correction information (the supporting information) on the basis of the difference between the total number of coil elements of the body coil in the first imaging and the total number of body coils being suitable for the second imaging (for example, the total number of body coils in the previous imaging), by the generation function 136. For example, the processing circuitry 150 generates the correction information (the supporting information) that "It is desirable to shift the position of the body coil to the foot direction by 5 cm" by the generation function 136. In addition, for example, the processing circuitry 150 generates the correction information (the supporting information) that "It is desirable to use the same number of coil elements as that in the previous imaging for imaging" by the generation function 136.

Subsequently, the processing circuitry 150 causes the display 135 to display the information generated by the processing circuitry 150 by using the generation function 136 in step S140, by the control function 133 (step S150). For example, as illustrated in FIG. 13, the processing circuitry 150 causes the display region 2 of the display 135 to display a message that "The current position of the body coil is different from that in the previous imaging. Please shift the position of the body coil to the foot direction by 5 cm" on the basis of the correction information (the supporting information) that "It is desirable to shift the position of the body coil to the foot direction by 5 cm", by the control function 133. In addition, for example, the processing circuitry 150 causes the display region 2 of the display 135 to display a message that "the number of coil elements used in the imaging is different from that in the previous imaging. It is recommended that the same number of coil elements as that in the previous imaging are used for the imaging." on the basis of the correction information (the supporting information) that "It is desirable to use the same number of coil elements as that in the previous imaging for the imaging", by the control function 133.

In addition, as illustrated in FIG. 13, for example, the processing circuitry 150 causes the display 135 to further display the number of elements of the array coil (body coil) in the first imaging and the number of elements of the array coil (body coil) that is suitable for the second imaging, by the control function 133. For example, the processing circuitry 150 causes the display region 83d to display the number of coil elements of the array coil in the first imaging, by the control function 133. In addition, for example, the processing circuitry 150 causes the display region 83b to display the number of elements of the array coil that is suitable for the second imaging (for example, the number of elements of the array coil in the previous imaging) by the control function 133. In addition, the processing circuitry 150 may cause the display region 83c to display the position of the body coil in the first imaging. In addition, the processing circuitry 150 may cause the display region 83a to display the position of the body coil that is suitable for the second imaging.

As described above, the magnetic resonance imaging apparatus 100 according to the ninth embodiment performs the setting for the position where the array coil is wound and the number of coil elements by using, for example, the locator image. Thereby, the image quality becomes stable.

Tenth Embodiment

In a tenth embodiment, setting for the array coil is performed as similar to the ninth embodiment. In the tenth embodiment, the positional relation between the body coil arranged in the abdomen side of the subject P and the spine coil arranged in the back side of the subject P is set. For the tenth embodiment, with reference to the flowchart in FIG. 2 again, and with reference to FIG. 14, a case where the positional relation between the elements of the array coil and the imaging object is set will be described.

Note that, in the flowchart in FIG. 2, processing in step S160 to step S190 is similar processing to that in the first embodiment. Thus, description for these steps will be omitted.

Figure 14:
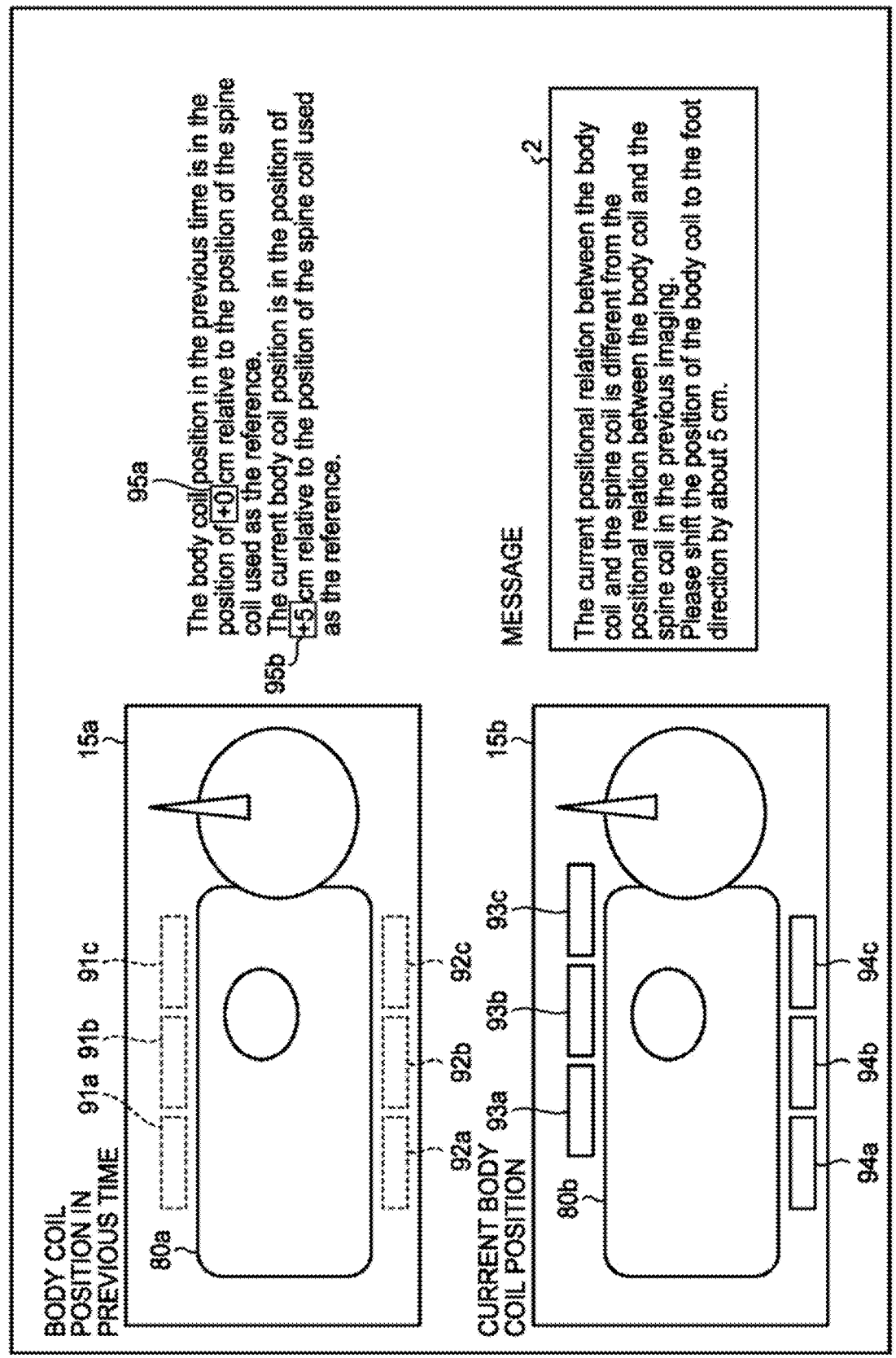
FIG. 14 is a diagram showing an example of a screen displayed by a magnetic resonance imaging apparatus according to a tenth embodiment.

FIG. 14 is a diagram showing an example of a screen displayed by a magnetic resonance imaging apparatus according to the tenth embodiment.

In FIG. 14, the image 15b is a locator image generated on the basis of the first imaging. The subject 80b represents a subject. Coil elements 93a, 93b, 93c represent respective coil elements of the body coil arranged in the abdomen side of the subject P. Coil elements 94a, 94b, 94 c represent respective coil elements of the spline coil arranged in the back side of the subject P. On the other hand, the image 15a is an image generated on the basis of the imaging imaged in the previous time. The subject 90a represents a subject. Coil elements 91a, 91b, 91c represent respective coil elements of the body coil arranged in the abdomen side of the subject P. Coil elements 92a, 92b, 92c represent respective coil elements of the spine coil arranged in the back side of the subject P. The display region 2 is a region that displays a message to the user. A display region 95b is a display region that displays the relative position of the body coil in the first imaging with the spine coil as a reference. A display region 95a is a display region that displays the relative position of the body coil with the spine coil as a reference, that is suitable for the second imaging (for example, the relative position of the body coil with the spine coil as a reference in the previous time).

With reference to the flowchart in FIG. 2 again, first, the sequence control circuitry 120 performs the first imaging on the subject P as similar to the first embodiment (step S100).

Following describes a case where imaging of the heart is performed as the body part to be imaged. However, the embodiment is not limited to this case. The embodiment can be applied similarly to other body parts to be imaged.

Subsequently, the processing circuitry 150 acquires the first position in the first imaging (step S110). In the tenth embodiment, the first position refers to, for example, the positional relation between the arranged position of a first array coil arranged in the abdomen side in the first imaging (coil elements 93a to 33c), and a second array coil arranged in the back side in the first imaging (coil elements 94a to 94c). The processing circuitry 150 acquires the positional relation between the arrangement position of the coil elements 93a to 93c and the arrangement position of the coil elements 94a to 94c, by the generation function 136.

Subsequently, the processing circuitry 150 estimates and acquires the second position that is suitable for the second imaging performed after the first imaging (step S120). The second position refers to, for example, the positional relation between the arrangement position of the first array coil (coil elements 93a to 93c) that is suitable for the second imaging, that is, the arrangement positions of the coil elements 91a to 91c, and the arrangement position of the second array coil (coil elements 94a to 94c) that is suitable for the second imaging, that is, the coil elements 92a to 92c. In other words, the processing circuitry 150, for example, acquires the positional relation between the arrangement position of the coil elements 91a to 91c and the arrangement position of the coil elements 92a to 92c, by the generation function 136.

The processing circuitry 150 determines whether the current setting is within the acceptable range, by the determination function 137 (step S130).

When the processing circuitry 150 determines that the current setting is within the acceptable range, by the determination function 137 (Yes at step S130), the correction of the position of the coil is not necessary. Thus, the processing proceeds to step S180, and the processing circuitry 150 stores the current position as setting information. After that the sequence control circuitry 120 per forms the second imaging on the subject P in step S390.

On the other hand, when the processing circuitry 150 determines that the current setting is not within the acceptable range, by the determination function 137 (No at step S130), the processing proceeds to step S140.

Subsequently, the processing circuitry 150 generates the correction information (the supporting information) on the basis of the difference between the positional relation between the arrangement position of the first array coil (coil elements 93a to 93c) arranged in the abdomen side in the first imaging and the arrangement position of the second array coil (coil elements 94a to 94c) arranged in the back side in the first imaging, and the positional relation between the arrangement position of the first array coil that is suitable for the second imaging (arrangement position of the coil elements 91a to 91c) and the arrangement position of the second array coil that is suitable for the second imaging (arrangement position of the coil elements 92a to 92c), by the generation function 136. For example, the processing circuitry 150 generates the correction information (the supporting information) that "It is desirable to shift the position of the body coil to the foot direction by about 5 cm." by the generation function 136.

Subsequently, the processing circuitry 150 causes the display 135 to display the information generated by the processing circuitry 150 by using the generation function 136 in step S140, by the control function 133 (step S150). For example, as illustrated in FIG. 14, the processing circuitry 150 causes the display region 2 of the display 135 to display a message that "The current positional relation between the body coil and the spine coil is different from the positional relation between the body coil and the spine coil in the previous imaging. Please shift the position of the body coil to the foot direction by about 5 cm." on the basis of the correction information (the supporting information) that "It is desirable to shift the position of the body coil to the foot direction by about 5 cm" by the control function 133.

In addition, as illustrated in FIG. 14, the processing circuitry 150 causes the display region 95b to display the position of the body coil in the first imaging with the position of the spine coil as a reference, by the control function 133. In addition, for example, the processing circuitry 150 causes the display region 95a to display the position of the body coil that is suitable for the second imaging with the position of the spine coil as a reference, by the control function 133.

As described above, the magnetic resonance imaging apparatus 100 according to the tenth embodiment, for example, performs the setting for the relational position between the body coil and the spine coil by using the locator image. Thereby, the image quality becomes stable.

Computer Program

In addition, the instructions indicated in the processing procedure indicated in the embodiments described above can be performed on the basis of a computer program that is software. Similar effect as the effect of the magnetic resonance imaging apparatus 100 according to the embodiments described above can be acquired by a general purpose computer storing this computer program beforehand and reading this computer program. The instructions written in the embodiments described above are stored as a computer-executable program on a storing medium such as a magnetic disc (a flexible disc, a hard disc, etc.), an optical disc (a compact disc read-only memory (CD-ROM), a compact disc storable (CD-R), a compact disc rewritable (CD-RW), a digital versatile disc read-only memory (DVD-ROM), a DVD±R, a DVD±RW, etc.), a semiconductor memory, or the like. As long as a computer or an incorporated system can read data from the storage medium, any storage format may be used. The computer can implement the same operations as those implemented by the magnetic resonance imaging apparatus 100 in the embodiments described above, by reading the computer program from the recoding medium and causing a CPU to execute the instructions written in the computer program on the basis of the computer program. In addition, when acquiring or reading the computer program, the computer may acquire or read the computer program via a network.

In addition, on the basis of the instructions in the computer program installed from the storage medium onto the computer or the incorporated system, an operating system (03) working in the computer, or middleware (MW) such as database management software or a network may execute a part of the processes that implement any of the embodiments described above. Further, the storage medium does not necessarily have to be a medium independent from the computer or the incorporated system. The storage medium may be a medium that stores therein or temporarily stores therein the computer program transferred and downloaded via a local area network (LAM) or the Internet. In addition, the storage medium does not necessarily have to be a single storage medium. The storage medium according to the embodiments described above includes a case where the processes in the embodiment described above are executed from a plurality of media. The medium or media may have any configuration.

Further, the computer or the incorporated system according to the embodiments is configured to execute the processes in the embodiment described above on the basis of the computer program stored in the storage medium or media. Accordingly, the computer or the incorporated system may have any configuration and may be configured with a single apparatus such as a personal computer or a microcomputer, or may be configured with a system or the like in which a plurality of apparatuses are connected to one another via a network. In addition, the computer according to the embodiments does not necessarily have to be a personal computer. The computer may be an arithmetic processing unit included in an information processing device, a microcomputer, or the like. The computer in the embodiments generally refers to any device or apparatus capable of implementing the functions in the embodiments by using a computer program.

Hardware Configuration

Figure 15:
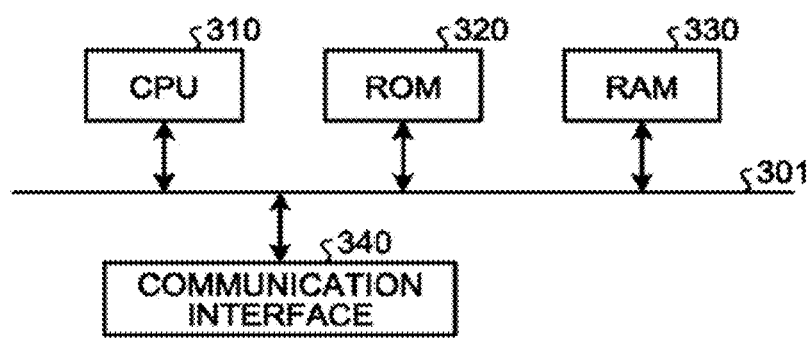
FIG. 15 is a diagram showing a hardware configuration of an image processing apparatus according to the embodiments.

FIG. 15 is a diagram showing a hardware configuration of an image processing apparatus 130 according to the embodiments. The image processing apparatus 130 according to the embodiments described above includes a control device such as a central processing unit (CPU) 310, a storage device such as a read only memory (ROM) 320 and a random access memory (RAM) 330, a communication I/F 340 that communicates by connecting to the network, and a bus 301 that connects respective parts.

The computer programs executed in the image processing apparatus 130 according to the embodiments described above are provided by being incorporated to the ROM 320, or the like beforehand. In addition, the computer program executed in the image processing apparatus 130 according to the embodiments described above can cause the computer to function as each part of the image processing apparatus 230 described above. This computer can read out the computer programs from the computer-readable storage medium to the main storage device, and execute the computer programs by the CPU 310.

As described above, according to at least one embodiment, a condition on the setting of the subject can be displayed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and chances in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
   sequence control circuitry configured to perform first imaging and second imaging to a subject; and
   processing circuitry configured to detect a position of the subject by using a magnetic resonance image acquired from the first imaging, and cause a display to display supporting information that supports the position of the subject based on information detected, wherein
   the sequence control circuitry is configured to perform the second imaging on the subject after the supporting information is displayed.

2. A magnetic resonance imaging apparatus comprising:
   sequence control circuitry configured to perform first imaging and second imaging to a subject; and
   processing circuitry configured to detect a state of a setting of the subject by using a magnetic resonance image acquired from the first imaging, and cause a display to display supporting information that supports the setting of the subject based on information detected, wherein
   the sequence control circuitry is configured to perform the second imaging on the subject after the supporting information is displayed, and
   the processing circuitry is configured to detect a feature point of a body part of the subject from the magnetic resonance image acquired from the first imaging, and is configured to detect the state of the setting of the subject by using the detected feature point.

3. The magnetic resonance imaging apparatus according to claim 2, wherein the processing circuitry is configured to detect the state of the setting of the subject on a basis of a distance between the feature point detected from the magnetic resonance image acquired from the first imaging and a center of a coil.

4. The magnetic resonance imaging apparatus according to claim 3, wherein
the first imaging and the second imaging are imaging including a knee part of the subject,
the processing circuitry is configured to detect the state of the setting of the subject on a basis of a distance between the feature point of a knee detected from the magnetic resonance image acquired from the first imaging and the center of the coil, and is configured to cause the display to display the supporting information that compares the distance to a threshold.

5. The magnetic resonance imaging apparatus according to claim 1, wherein the processing circuitry is configured to generate information that represents a difference between a first position that is a position of the subject in the first imaging and a second position that is a position of the subject being suitable for the second imaging, as the supporting information, on a basis of the magnetic resonance image.

6. The magnetic resonance imaging apparatus according to claim 5, wherein the processing circuitry is configured to estimate the second position on a basis of imaging previously performed on the subject, and is configured to generate the supporting information on a basis of an estimated result by the processing circuitry.

7. The magnetic resonance imaging apparatus according to claim 5, wherein the processing circuitry is configured to estimate the second position on a basis of statistical data, and is configured to generate the supporting information on a basis of an estimated result by the processing circuitry.

8. The magnetic resonance imaging apparatus according to claim 5, wherein the processing circuitry is configured to determine whether the first position is a position that is suitable for the second imaging, on a basis of the magnetic resonance image, and configured to cause the display to display a determined result.

9. The magnetic resonance imaging apparatus according to claim 1, wherein the sequence control circuitry is configured to wait until completion of correction of a position of the subject by at least one of a user and the subject himself/herself performed on a basis of the supporting information, and is configured to perform the second imaging after the completion of the correction of the position of the subject.

10. The magnetic resonance imaging apparatus according to claim 1, wherein the second imaging is imaging for at least one of a knee, a breast, a brain, a shoulder, a spine, and an abdomen.

11. The magnetic resonance imaging apparatus according to claim 1, wherein
the first imaging is performed including a knee part on the subject,
the second imaging is performed including the knee part on the subject, and
the processing circuitry is configured to generate the supporting information on a basis of a difference between an angle of knee bending of the subject in the magnetic resonance image, and an angle of knee bending that the subject is supposed to keep in the second imaging.

12. The magnetic resonance imaging apparatus according to claim 1, wherein the processing circuitry is configured to generate the supporting information on a basis of a difference between a degree of neck bending of the subject in the magnetic resonance image, and a degree of neck bending that the subject is supposed to keep in the second imaging.

13. The magnetic resonance imaging apparatus according to claim 1, wherein the supporting information is information for aligning a direction of the subject to a static magnetic field.

14. The magnetic resonance imaging apparatus according to claim 13, wherein the processing circuitry is configured to detect a longitudinal direction of a bone included in the magnetic resonance image, and is configured to generate the supporting information on a basis of the detected longitudinal direction of the bone.

15. The magnetic resonance imaging apparatus according to claim 1, wherein
the first imaging is performed including an arm part on the subject, and
the processing circuitry is configured to generate the supporting information on a basis of a difference between a position of an arm of the subject in the magnetic resonance image, and a position of the arm that the subject is supposed to keep in the second imaging.

16. The magnetic resonance imaging apparatus according to claim 1, wherein
the first imaging is performed including a first bone and a second bone on the subject,
the second imaging is performed including the first bone and the second bone on the subject, and
the processing circuitry is configured to generate the supporting information on a basis of a difference between an angle of twisting of the first bone with respect to the second bone in the magnetic resonance image, and an angle of twisting of the first bone with respect to the second bone that the subject is supposed to keep in the second imaging.

17. The magnetic resonance imaging apparatus according to claim 16, wherein the angle of twisting of the first bone with respect to the second bone in the magnetic resonance image is an angle of twisting calculated on a basis of a feature point extracted from the magnetic resonance image.

18. The magnetic resonance imaging apparatus according to claim 1, wherein the processing circuitry is configured to generate the supporting information on a basis of a difference of an arrangement position of an array coil in the first imaging and an arrangement position of an array coil that is suitable for the second imaging.

19. The magnetic resonance imaging apparatus according to claim 18, wherein the arrangement position of the array coil in the first imaging is an arrangement position estimated on a basis of a signal profile of the magnetic resonance image.

20. The magnetic resonance imaging apparatus according to claim 1, wherein the processing circuitry is configured to generate the supporting information on a basis of a difference between a positional relation between an arrangement position of a first array coil arranged in an abdomen side in the first imaging and an arrangement position of a second array coil arranged in a back side in the first imaging, and a positional relation between an arrangement position of the first array coil and an arrangement position of the second array coil, the arrangement position of the first array coil and the arrangement position of the second array coil being suitable for the second position.

21. The magnetic resonance imaging apparatus according to claim 1, wherein the processing circuitry is configured to cause the display to further display number of elements of an array coil in the first imaging and number of elements of the array coil that is suitable for the second imaging.

22. An image processing apparatus comprising:
processing circuitry configured to
detect a position of a subject by using a magnetic resonance image acquired from first imaging performed by sequence control circuitry on the subject, and
cause a display to display supporting information that supports the position of the subject in second imaging performed after the first imaging, based on information detected.

* * * * *